United States Patent
Teeter et al.

(10) Patent No.: US 11,160,196 B1
(45) Date of Patent: Oct. 26, 2021

(54) MICRO-STRAND HEAT DISSIPATION SYSTEM

(71) Applicant: Dell Products L.P., Round Rock, TX (US)

(72) Inventors: Victor Teeter, Round Rock, TX (US); Shree Rathinasamy, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 13 days.

(21) Appl. No.: 15/929,657

(22) Filed: May 14, 2020

(51) Int. Cl.
*H05K 7/20* (2006.01)
*G06F 1/20* (2006.01)

(52) U.S. Cl.
CPC .......... *H05K 7/20445* (2013.01); *G06F 1/20* (2013.01); *H05K 7/2039* (2013.01); *H05K 7/20409* (2013.01)

(58) Field of Classification Search
CPC .... G06F 1/20; H05K 7/2039; H05K 7/20409; H05K 7/20445
See application file for complete search history.

(56) References Cited

U.S. PATENT DOCUMENTS

| | | | | |
|---|---|---|---|---|
| 4,450,505 A | * | 5/1984 | Mittal | H01L 23/3677 257/E23.091 |
| 4,485,429 A | * | 11/1984 | Mittal | F28F 3/022 165/104.33 |
| 5,852,548 A | * | 12/1998 | Koon | H05K 1/0209 361/704 |
| 6,913,075 B1 | * | 7/2005 | Knowles | B82Y 10/00 165/185 |
| 9,831,153 B1 | * | 11/2017 | Huang | H01L 23/3737 |
| 2008/0314557 A1 | * | 12/2008 | Banerji | B01L 7/52 165/80.3 |
| 2016/0330872 A1 | * | 11/2016 | Shelnutt | H05K 7/20809 |
| 2020/0061714 A1 | * | 2/2020 | Hirose | B22F 7/04 |

* cited by examiner

*Primary Examiner* — Jacob R Crum
(74) *Attorney, Agent, or Firm* — Joseph Mencher

(57) ABSTRACT

A micro-strand heat dissipation system includes a first processing device and a plurality of first micro-strand heat dissipator elements that are each positioned on the first processing device in a spaced apart orientation from the other first micro-strand heat dissipator elements. Each of the plurality of first micro-strand heat dissipator elements include a first micro-strand heat dissipator element portion that extends into the first processing device from an outer surface of the first processing device, and a second micro-strand heat dissipator element portion that extends from the outer surface of the first processing device. The first processing device may define a plurality of micro-strand heat dissipator connector features to which each of the plurality of first micro-strand heat dissipator elements may be connected, or the plurality of first micro-strand heat dissipator elements may be integrated as part of the first processing device.

20 Claims, 29 Drawing Sheets

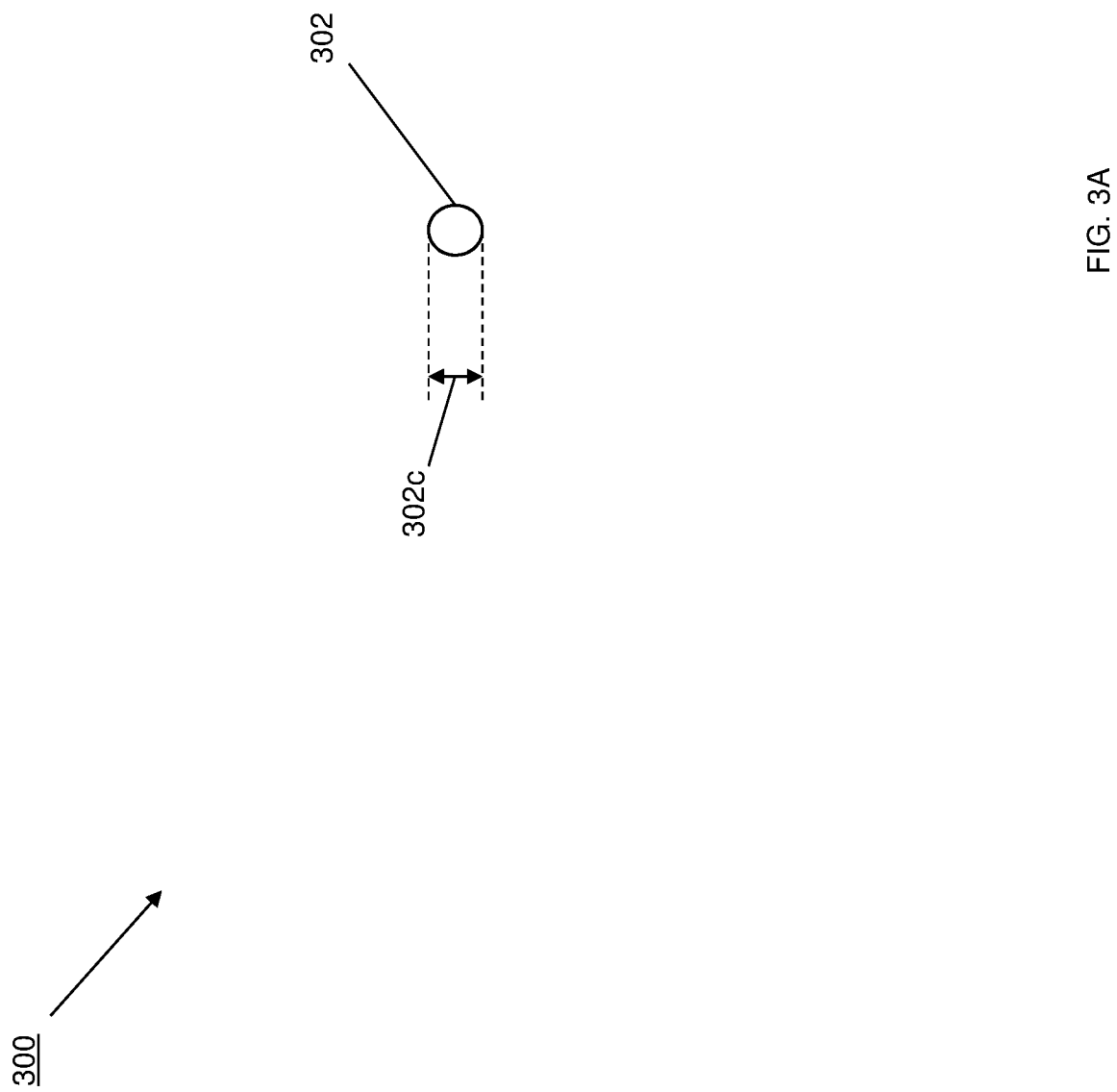

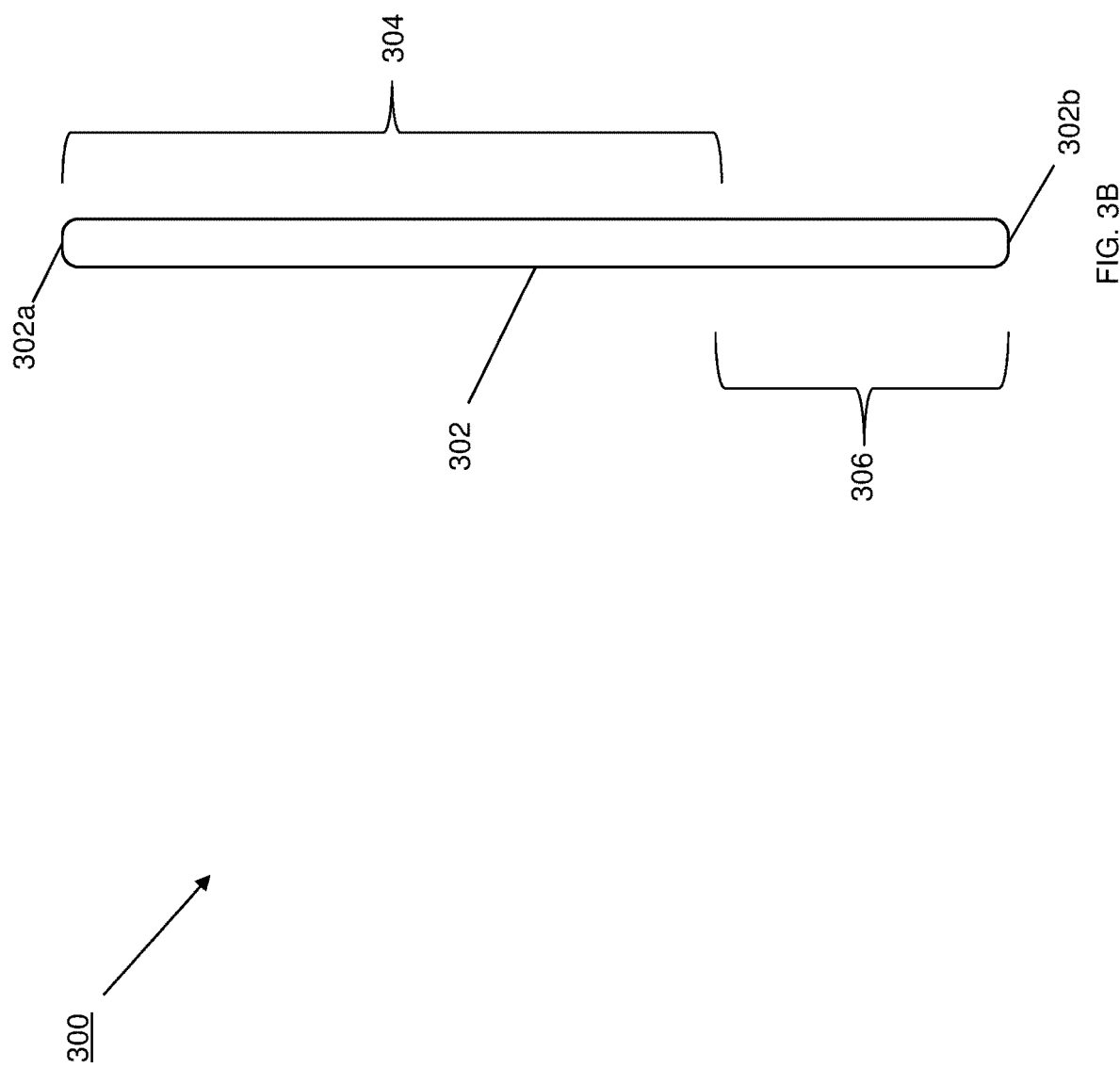

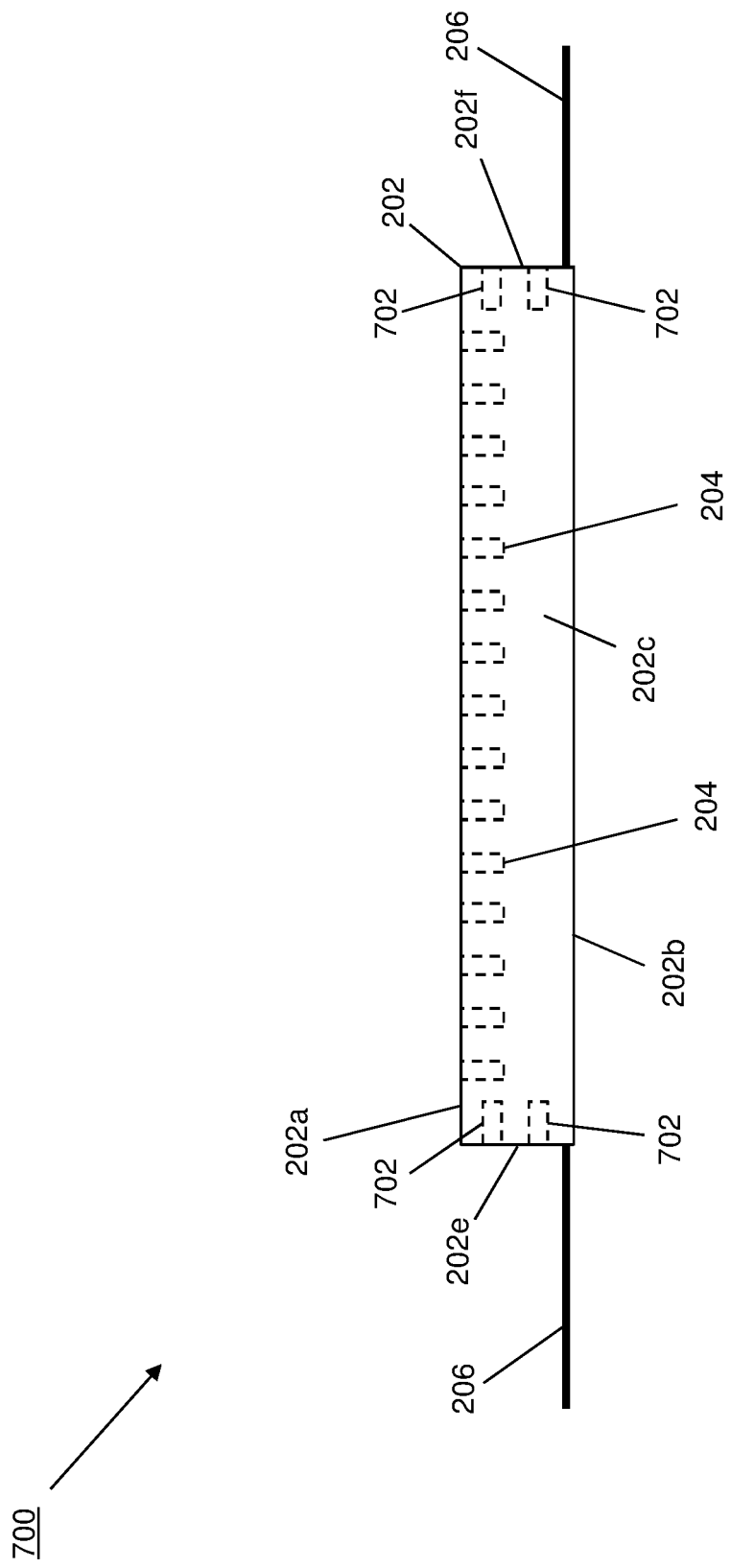

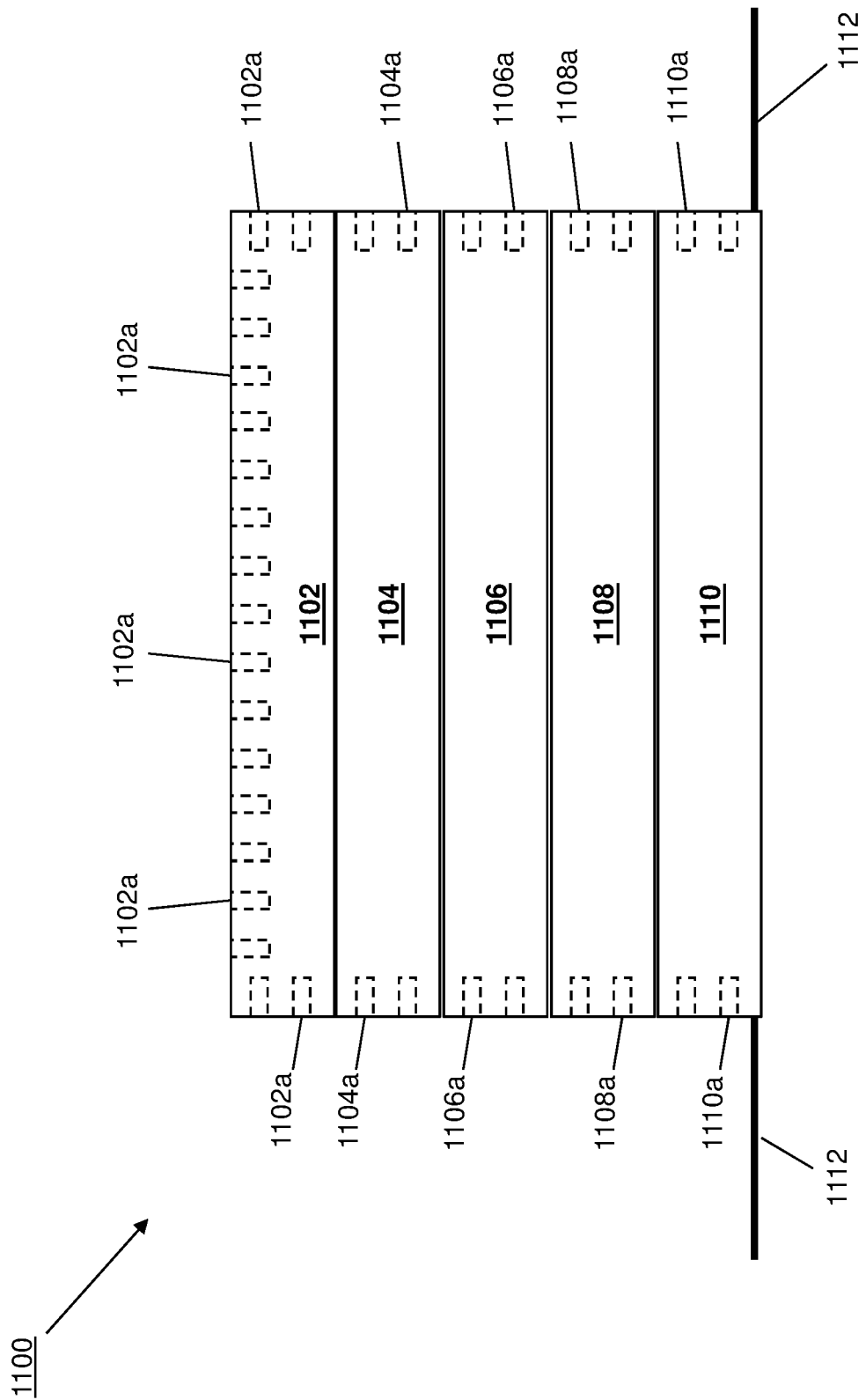

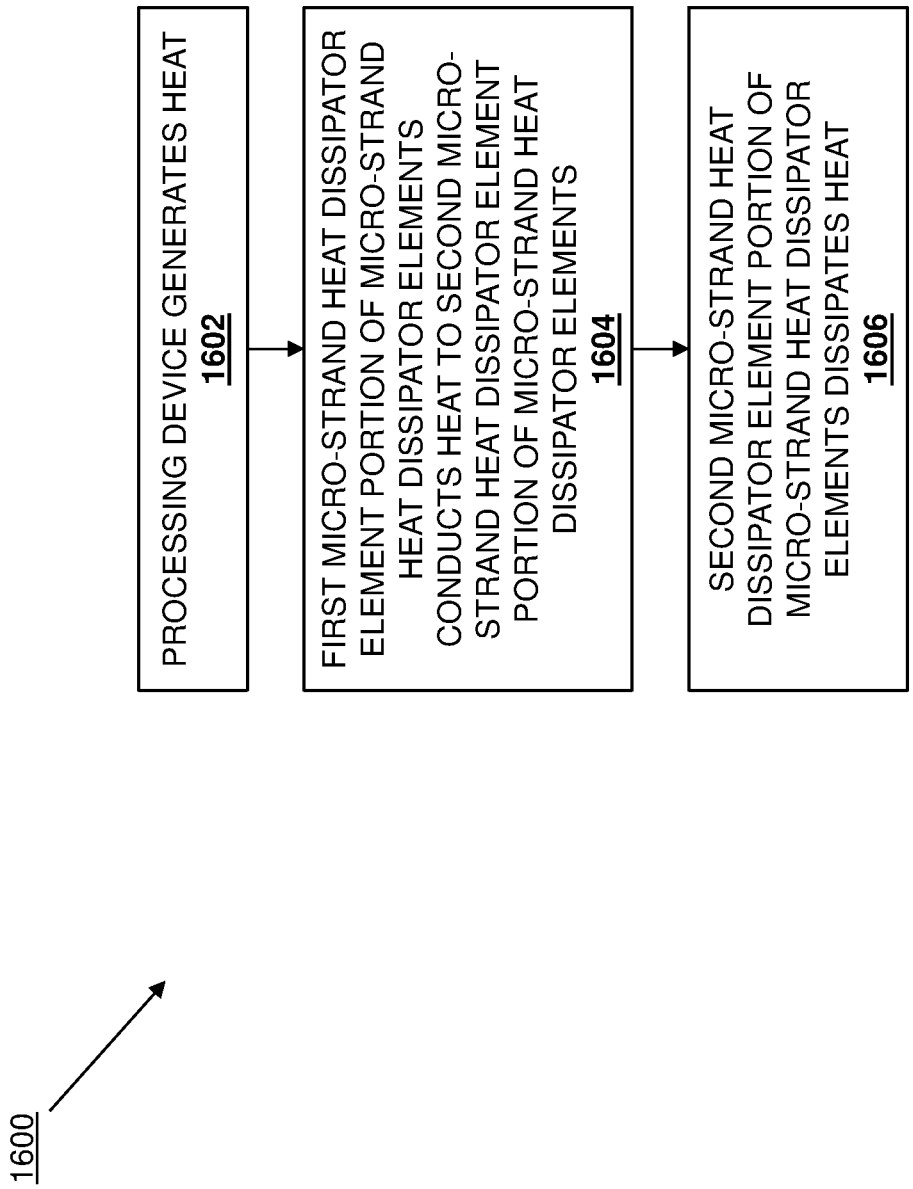

MICRO-STRAND HEAT DISSIPATION SYSTEM

BACKGROUND

The present disclosure relates generally to information handling systems, and more particularly to the dissipation of heat generated by an information handling system using micro-strand heat dissipator elements.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Processing devices in information handling systems such as, for example, switch devices and other networking and/or computing devices known in the art, are capable of generating relatively high amounts of heat that must be dissipated. For example, silicon photonics processing devices are provided by integrated circuits that utilize silicon as an optical medium to create a processing device with the ability to process optical data signals, which is viewed as a solution to the issues associated with how to provide the relatively high signal transmission rates required by next generation switch/networking devices. However, silicon photonics processing devices tend to be provided with a relatively high circuit density, and high performance silicon photonics processing devices can generate relatively high amounts of heat that must be dissipated, particularly as the port density and port speeds of the ports in the switch device in which they are utilized increase (as is the case with many next generation switch/networking devices). As will be appreciated by one of skill in the art, the relatively higher amount of heat generated by the silicon photonics processing devices discussed above may result in the disruption of the optical data signals in the silicon photonics processing device due to the heat or due to noise created by thermal issues, frequency shifts in the optical data signals, failure of the silicon photonics processing device, higher heat stresses that can result in switch device component failures, higher performance cooling components being required for the switch device that increase costs, higher levels of cooling system operation that can cause cooling system component failure and/or increased energy consumption costs, and/or other heat-related issues known in the art.

Accordingly, it would be desirable to provide a processing device heat dissipation system that addresses the issues discussed above.

SUMMARY

According to one embodiment, an Information Handling System (IHS) includes a chassis; a memory system that is included in the chassis and that stores instructions; and a first processing device that is included in the chassis, coupled to the memory system, configured to read instructions from the memory system to perform one or more operations; and a plurality of first micro-strand heat dissipator elements that are each positioned on the first processing device in a spaced apart orientation from the other first micro-strand heat dissipator elements, wherein each of the plurality of first micro-strand heat dissipator elements include: a first micro-strand heat dissipator element portion that extends into the first processing device from an outer surface of the first processing device; and a second micro-strand heat dissipator element portion that extends from the outer surface of the first processing device.

BRIEF DESCRIPTION OF THE DRAWINGS

FIG. 3A is a schematic top view illustrating an embodiment of a micro-strand heat dissipation element that may be utilized with the processing device of FIGS. 2A and 2B.

FIG. 3B is a schematic side view illustrating an embodiment of the micro-strand heat dissipation element of FIG. 3A.

FIG. 7 is a schematic side view illustrating an embodiment of a processing device that may utilized the micro-strand heat dissipation system of the present disclosure.

FIG. 11A is a schematic side view illustrating an embodiment of a stacked processing system that may utilized the micro-strand heat dissipation system of the present disclosure.

FIG. 16 is a flow chart illustrating an embodiment of a method for dissipating heat.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
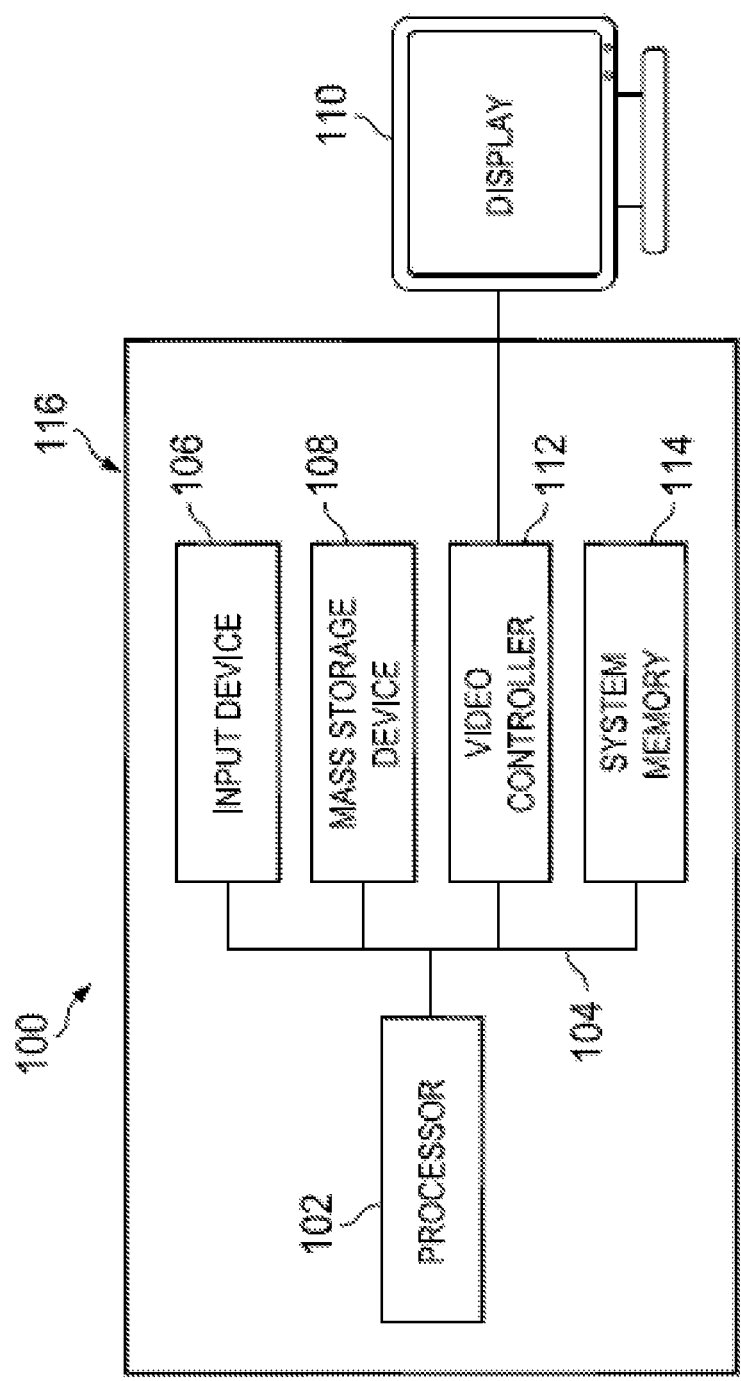
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
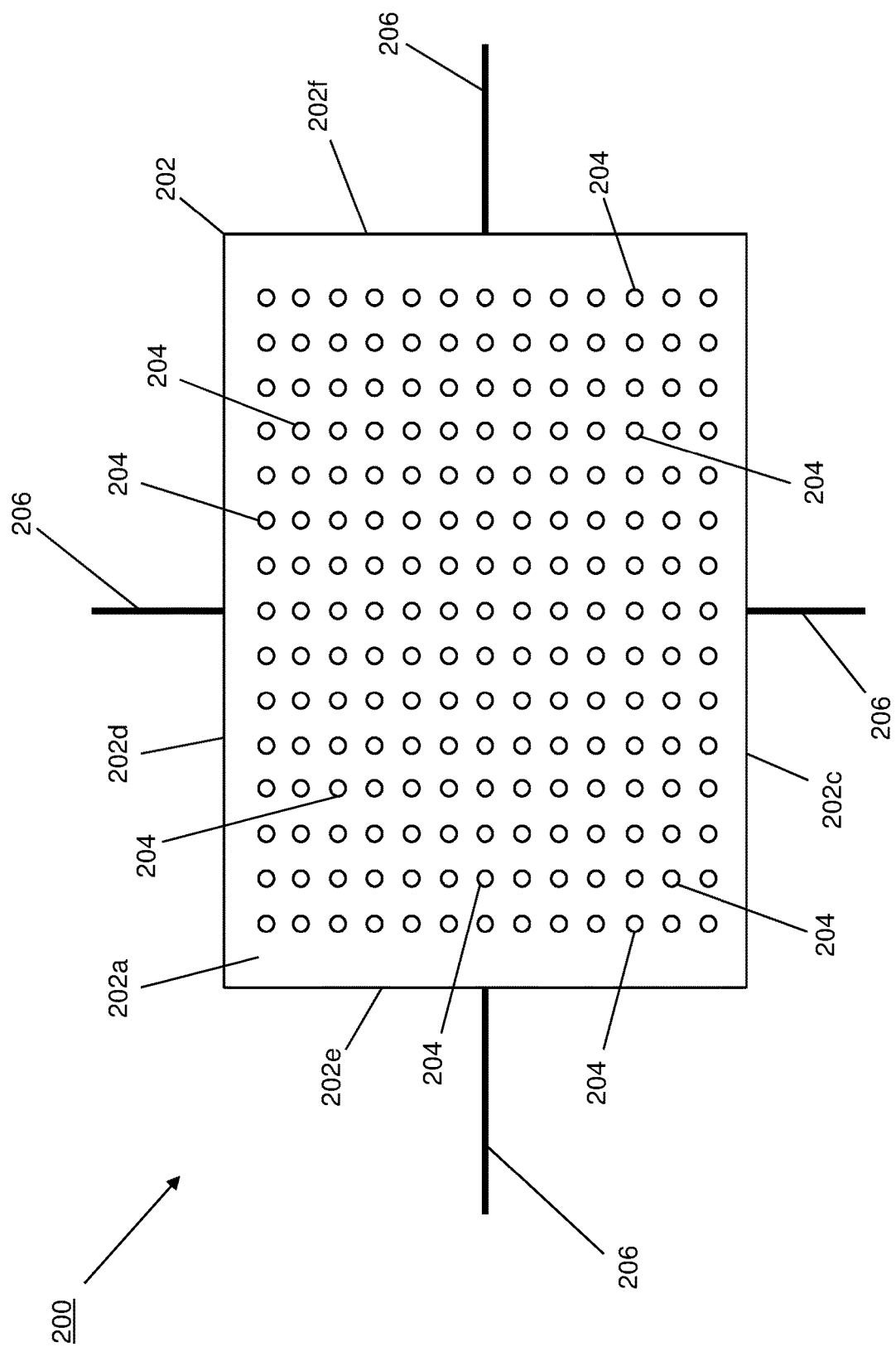
FIG. 2A is a schematic top view illustrating an embodiment of a processing device that may utilize the micro-strand heat dissipation system of the present disclosure.
Figure 2B:
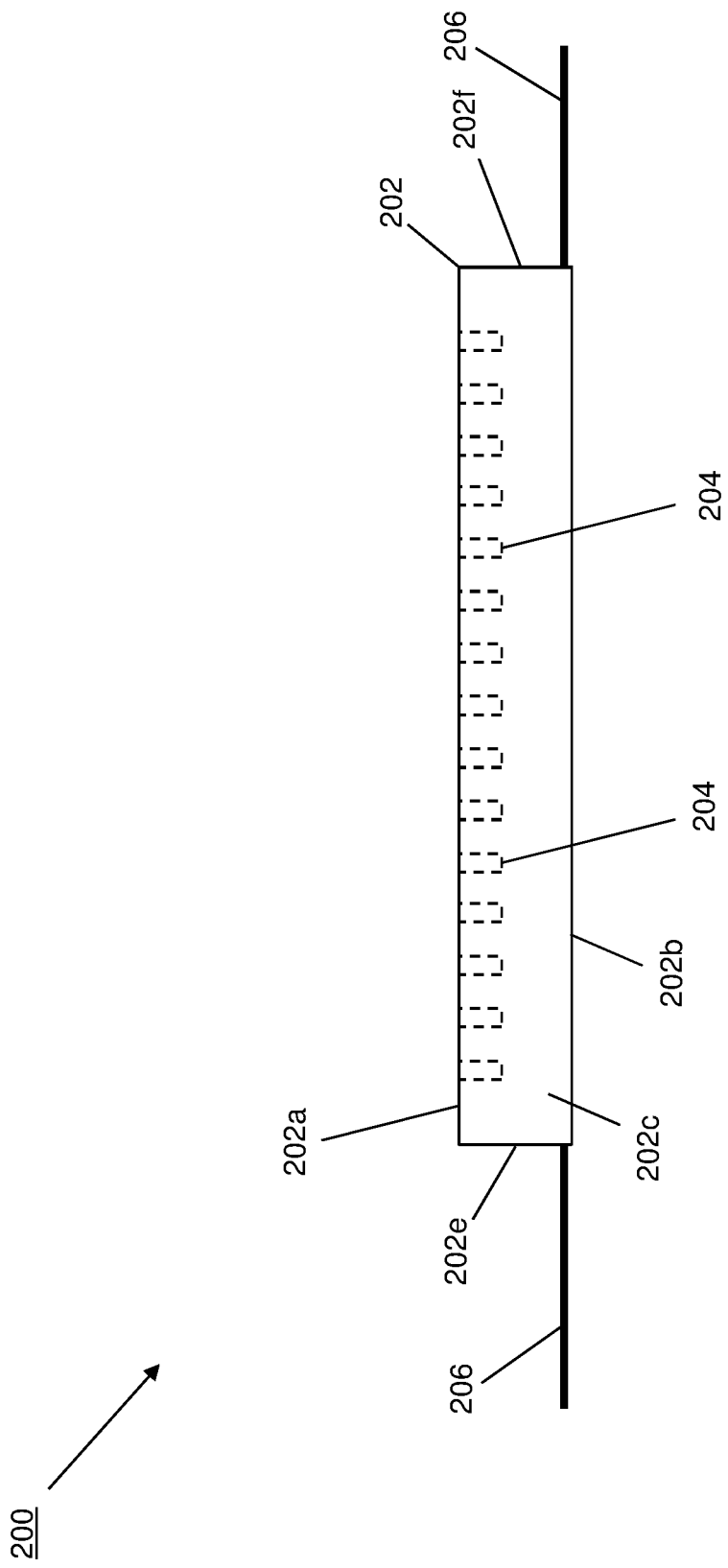
FIG. 2B is a schematic side view illustrating an embodiment of the processing device of FIG. 2A.

Referring now to FIGS. 2A and 2B, an embodiment of a processing device 200 is illustrated that may utilize the micro-strand heat dissipation system of the present disclosure. In many of the examples discussed below, the processing device 200 is described as being provided by a silicon photonics integrated circuit. However, one of skill in the art in possession of the present disclosure will recognize that the processing device 200 may be provided by other processing devices, integrated circuits, and/or heat producing devices while remaining within the scope of the present disclosure as well. In an embodiment, the processing device 200 may be provided as the processor 102 in the IHS 100 discussed above with reference to FIG. 1, or the functionality of the micro-strand heat dissipation system of the present disclosure may be utilized with another heat producing device that is included in the IHS 100. As such, while illustrated and discussed as a processing device, one of skill in the art in possession of the present disclosure will recognize that devices utilizing the micro-strand heat dissipation system of the present disclosure may include any heat producing devices that may be configured to operate similarly as the processing device 200 discussed below.

In the illustrated embodiment, the processing device 200 includes a base 202 having an outer surface that includes a top surface 202a, a bottom surface 202b that is located opposite the base 202 from the top surface 202a, a front surface 202c extending between the top surface 202a and the bottom surface 202b, a rear surface 202d located opposite the base 202 from the front surface 202c and extending between the top surface 202a and the bottom surface, and a pair of side surfaces 202e and 202f that are located opposite the base 202 from each other and that extend between the top surface 202a, the bottom surface 202b, the front surface 202c, and the rear surface 202d. In the schematic illustration of the processing devices provided herein, the base is a rectangle with the front surface, rear surface, and side surfaces of that base oriented perpendicularly to the top surface and the bottom surface of that base, but one of skill in the art in possession of the present disclosure will recognize how the base of a processing system may be provided in different shapes with its front surface, rear surface, and side surfaces oriented at different angles to its top surface and bottom surface, and how those angles may be considered as substantially perpendicular while remaining within the scope of the present disclosure as well.

In some embodiments, processing devices provided in the micro-strand heat dissipation system of the present disclosure may include micro-strand heat dissipator connector features, a specific example of which are illustrated in FIGS. 2A and 2B as a plurality of micro-strand heat dissipator connector holes 204 that are defined by the base 202 and that extend into the base 202 from the top surface 202a. In the example illustrated in FIGS. 2A and 2B, the micro-strand heat dissipator connector holes 204 are provided in an equally spaced, 13×15 rectangular grid, with each micro-strand heat dissipator connector hole 204 extending substantially the same depth into the base 202. However, one of skill in the art in possession of the present disclosure will appreciate that the micro-strand heat dissipator connector holes 204 may be provided in any configuration and may extend different depths into the base 202 while remaining within the scope of the present disclosure as well. For example, in some embodiments the micro-strand heat dissipator connector holes 204 may be provided only in areas/volumes of the base 202 (and extending into the outer surface 202a of the base 202) that are known to become relatively hot during operation of the processing device 200, and may extend into the base 202 such that they are located immediately adjacent heat producing components in the base 202 in order to maximize the amount of cooling provided by the micro-strand heat dissipation system of the present disclosure, discussed in further detail below.

However, while illustrated and described herein as provided by "holes" extending into the base 202 of the processing device 200, one of skill in the art in possession of the present disclosure will recognize that other types of micro-strand heat dissipator connector features may be provided with the processing device 200 to allow the micro-strand heat dissipator elements (discussed below) to be connected to the processing device 200 in a variety of manners that will fall within the scope of the present disclosure as well. Furthermore, as described below, in other embodiments the micro-strand heat dissipator elements of the present disclosure may be integrated as part of processing devices, and thus the micro-strand heat dissipator connector features illustrated and described herein may be omitted, and the processing devices utilizing the micro-strand heat dissipation system of the present disclosure may instead be manufactured, fabricated, and/or otherwise produced with micro-strand heat dissipator element (i.e., rather than the micro-strand heat dissipator elements being connected to the processing device 200 via the micro-strand heat dissipator connector features as discussed in some of the embodiments below).

As illustrated in FIGS. 2A and 2B, processing device coupling elements 206 may extend from the front surface 202c, the rear surface 202d, and the side surfaces 202e and 202f of the base 202, and one of skill in the art in possession of the present disclosure will recognize how the processing device coupling elements 206 may be provided by any processing device/integrated circuit couplings that allow the processing device 200 to be coupled to other components (e.g., via a circuit board or other coupling medium known in the art.) However, while a specific processing device 200 has been illustrated and described, one of skill in the art in possession of the present disclosure will recognize that the micro-strand heat dissipation system of the present disclosure may include a variety of components and component configurations while remaining within the scope of the present disclosure as well.

Referring now to FIGS. 3A and 3B, an embodiment of a micro-strand heat dissipator element 300 is illustrated. In the illustrated embodiment, the micro-strand heat dissipator element 300 includes a base 302 that, in the examples discussed below, is provided with a circular cross-section along a majority of the base 302 such that the base 302 is substantially shaped as an elongated cylinder. However, while illustrated and described as provided by an elongated cylinder, one of skill in the art in possession of the present disclosure will recognize that the micro-strand heat dissipator elements of the present disclosure may be provided with cross-sections having different shapes other than those illustrated herein in order to provide the base of the micro-strand heat dissipator element with different shapes other than those illustrated while remaining within the scope of the present disclosure as well. In different embodiments, the base 302 may be provided using a copper material, an aluminum material, and/or other heat conducting materials that would be apparent to one of skill in the art in possession of the present disclosure.

As illustrated, the base 302 of the micro-strand heat dissipator element 300 includes a top end 302a and a bottom end 302b that is located opposite the base 302 from the top end 302a. Furthermore, the base 302 may include a diameter 302c (or other "thickness") that may vary based on the implementation of the micro-strand heat dissipation system. For example, in some embodiments the diameter 302c (or other thickness) of the base 302 of the micro-strand heat dissipator element 300 may be similar to that of a human hair (e.g., 0.04 mm to 0.1 mm). As such, one of skill in the art in possession of the present disclosure will appreciate that the examples of the micro-strand heat dissipator elements 300 illustrated herein may not be draw to scale in order to allow for features of those micro-strand heat dissipator elements 300 (as well as features of the processing device 200 in some embodiments) to be clearly visible for discussion. Furthermore, one of skill in the art in possession of the present disclosure will appreciate that larger diameters or thicknesses of the base 302 of the micro-strand heat dissipator element 300 may be utilized while remaining within the scope of the present disclosure as well.

As discussed in further detail below, the base 302 of the micro-strand heat dissipator element 300 may include a first micro-strand heat dissipator element portion 304 that extends between the top end 302a of the base 302 and a location on the base 302 that is located between the top end 302a and the bottom end 302b of the base 302, and that is configured to extend from an outer surface of the processing device with which it is utilized in the micro-strand heat dissipation system of the present disclosure. The base 302 of the micro-strand heat dissipator element 300 may also include a second micro-strand heat dissipator element portion 306 that extends from the first micro-strand heat dissipator element portion 304 of the base 302 and to the bottom end 302b of the base 302, and that is configured to extend into the base of the processing device with which it is utilized in the micro-strand heat dissipation system of the present disclosure. One of skill in the art in possession of the present disclosure will recognize that the length of the first micro-strand heat dissipator element portion 304 extending from the processing device and the length of the second micro-strand heat dissipator element portion 306 extending into the processing device may be selected based on heat dissipation requirements for the processing device, structural integrity of the micro-strand heat dissipator element 300, and/or any other system characteristics that would be apparent to one of skill in the art in possession of the present disclosure.

As such, one of skill in the art in possession of the present disclosure will appreciate that the length of the first micro-strand heat dissipator element portion and the second micro-strand heat dissipator element portion on any particular micro-strand heat dissipator element utilized in the micro-strand heat dissipation system of the present disclosure may vary relative to the first micro-strand heat dissipator element portion and the second micro-strand heat dissipator element portion on other micro-strand heat dissipator elements utilized in the micro-strand heat dissipation system of the present disclosure while remaining within the scope of the present disclosure. For example, as discussed in some embodiment of the present disclosure below, different micro-strand heat dissipator elements may extend different depths into the base of the processing device with which they are utilized in the micro-strand heat dissipation system of the present disclosure, and/or different micro-strand heat dissipator elements may extend different lengths from the outer surface on the base of the processing device with which they are utilized in the micro-strand heat dissipation system of the present disclosure. However, while a particular micro-strand heat dissipator element 300 has been described, one of skill in the art in possession of the present disclosure will appreciate that micro-strand heat dissipator elements may include a variety of configurations for providing the functionality discussed below while remaining within the scope of the present disclosure as well.

Figure 4A:
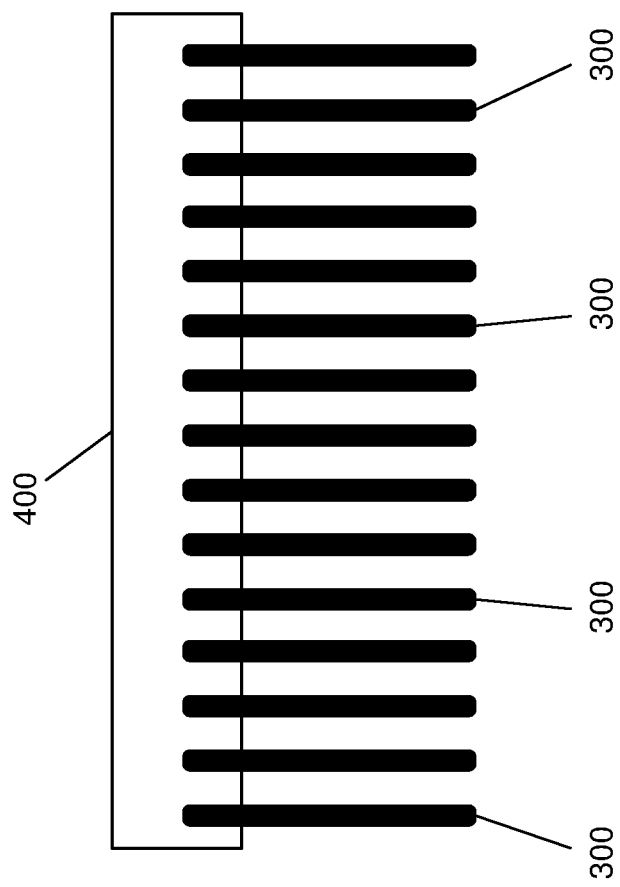
FIG. 4A is a schematic side view illustrating an embodiment of a plurality of the micro-strand heat dissipation elements of FIG. 3 provided for connection to a processing device.
Figure 4B:
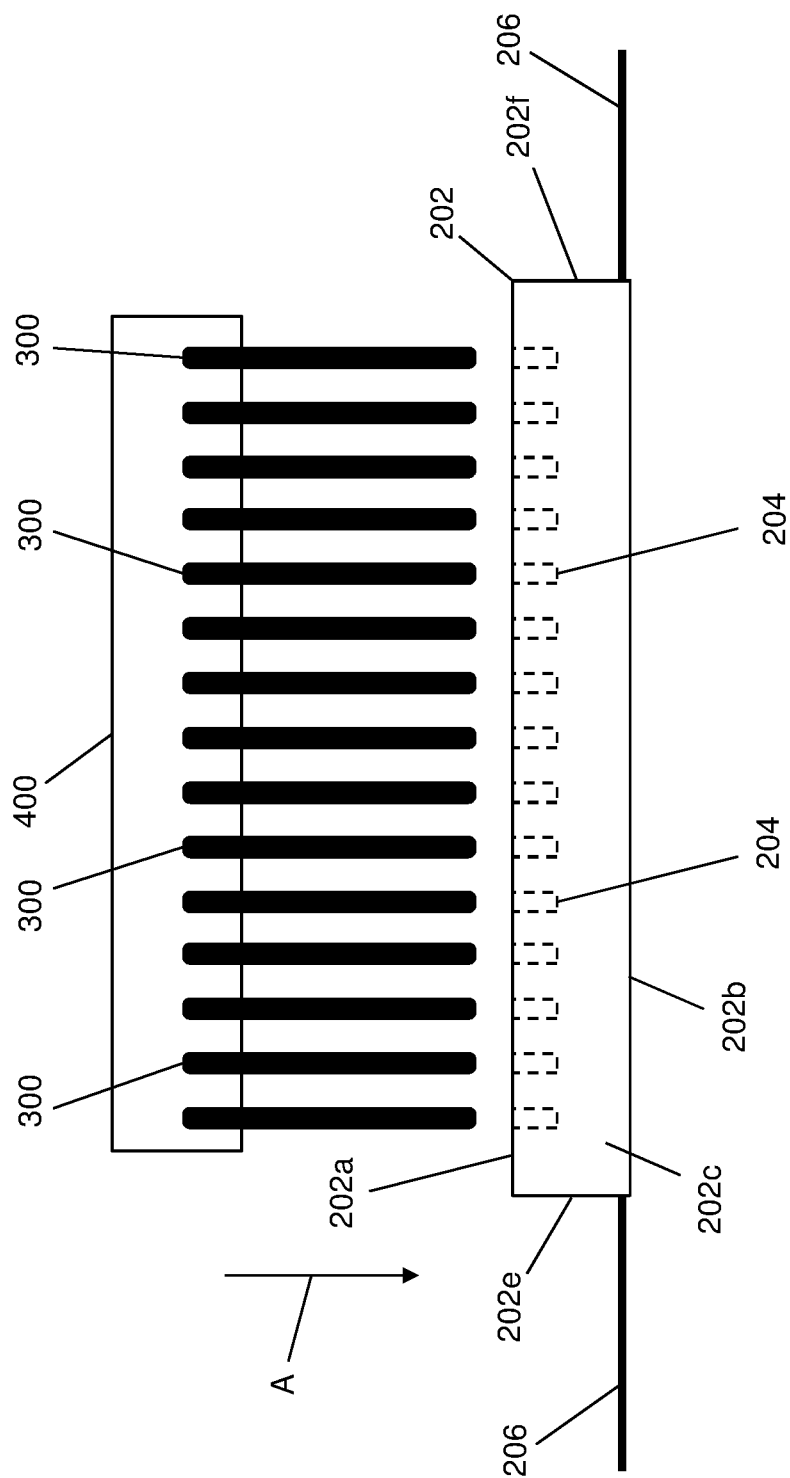
FIG. 4B is a schematic side view illustrating an embodiment of the plurality of micro-strand heat dissipation elements of FIG. 4A being connected to the processing device of FIGS. 2A and 2B.

In the embodiment illustrated in FIG. 4A, a micro-strand heat dissipator element carrier 400 is illustrated that is coupled to a plurality of the micro-strand heat dissipator elements 300 (e.g., to the top ends 302a of the base 302 on the micro-strand heat dissipator elements 300 discussed above with reference to FIG. 3) and that positions the micro-strand heat dissipator elements 300 in a configuration that corresponds to the configuration of the micro-strand heat dissipator connector features on the processing device to which those micro-strand heat dissipator elements 300 will be connected. For example, FIG. 4B illustrates how the micro-strand heat dissipator element carrier 400 coupled to the plurality of the micro-strand heat dissipator elements 300 may be positioned adjacent the top surface 202a of the processing device 200 such that respective micro-strand heat dissipator elements 300 are aligned with respective micro-strand heat dissipator connector holes 204 defined by the base 202 of the processing device 200. While not explicitly illustrated, one of skill in the art in possession of the present disclosure will appreciate that the micro-strand heat dissipator element carrier 400 may be coupled to the plurality of the micro-strand heat dissipator elements 300 in a variety of manners that allows the plurality of the micro-strand heat dissipator elements 300 to be released from the micro-strand heat dissipator element carrier 400 as discussed below.

Figure 4C:
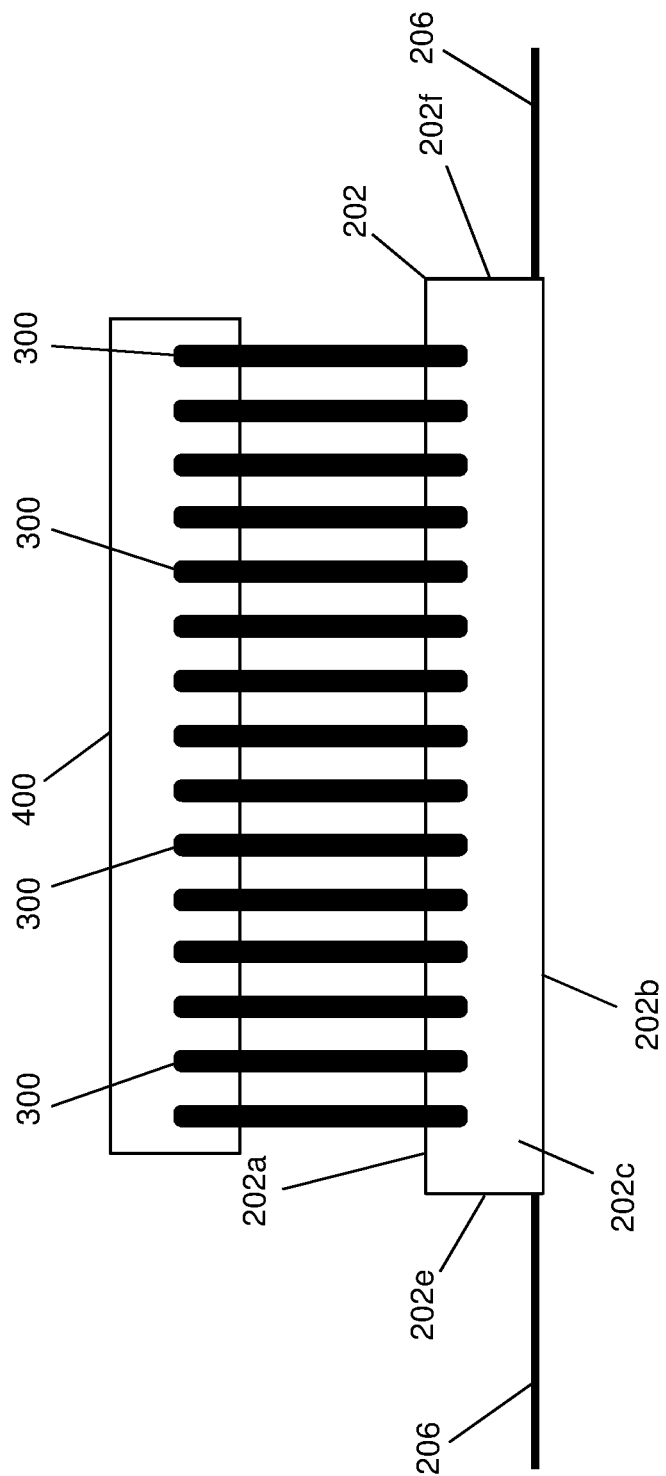
FIG. 4C is a schematic side view illustrating an embodiment of the plurality of micro-strand heat dissipation elements of FIG. 4A being connected to the processing device of FIGS. 2A and 2B.
Figure 4D:
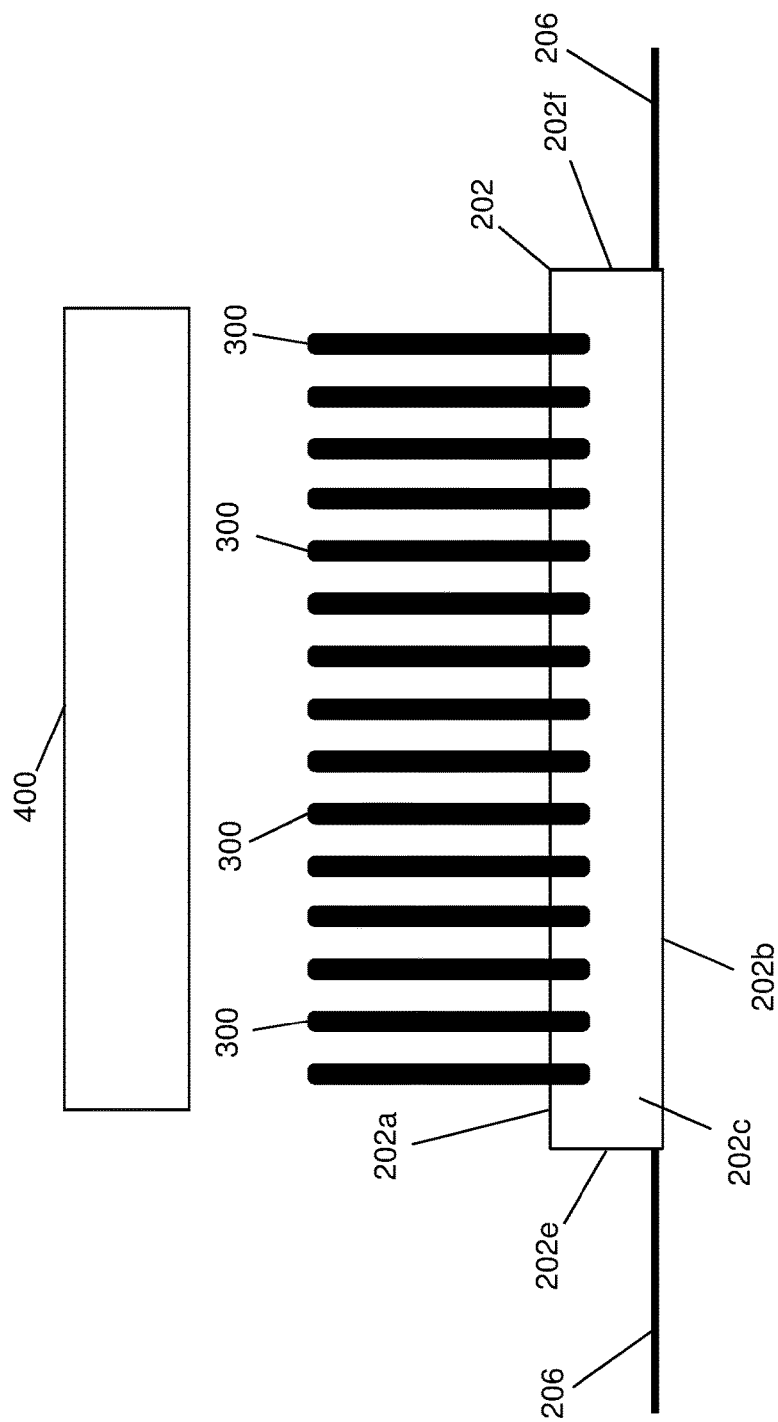
FIG. 4D is a schematic side view illustrating an embodiment of the plurality of micro-strand heat dissipation elements of FIG. 4A connected to the processing device of FIGS. 2A and 2B.

As illustrated in FIGS. 4B and 4C, the micro-strand heat dissipator element carrier 400 coupled to the plurality of the micro-strand heat dissipator elements 300 may be moved in a direction A such that each of the micro-strand heat dissipator elements 300 extend into the micro-strand heat dissipator connector holes 204. As illustrated in FIG. 4D, the plurality of the micro-strand heat dissipator elements 300 may then be released from the micro-strand heat dissipator element carrier 400, and the micro-strand heat dissipator element carrier 400 may be moved opposite the direction A. One of skill in the art in possession of the present disclosure will appreciate that the micro-strand heat dissipator elements 300 located in the micro-strand heat dissipator connector holes 204 defined by the base 202 of the processing device 200 may be connected to the base 202 and/or secured in the micro-strand heat dissipator connector holes 204 using a variety of techniques. For example, prior to positioning the micro-strand heat dissipator elements 300 in the micro-strand heat dissipator connector holes 204, a heat conductive adhesive may be provided on the bottom end 302b of the micro-strand heat dissipator elements 300 and/or micro-strand heat dissipator connector holes 204 defined by the base 202, and following the positioning of the micro-strand heat dissipator elements 300 in the micro-strand heat dissipator connector holes 204, that heat conductive adhesive may be allowed to dry to connect/secure the micro-strand heat dissipator elements 300 to the micro-strand heat dissipator connector holes 204 defined by the base 202 of the processing device 200. However, in other embodiments, mechanical couplings and/or other coupling subsystems known in the art may be utilized to connect/secure the micro-strand heat dissipator elements 300 to the micro-strand heat dissipator connector holes 204 defined by base 202 of the processing device 200 while remaining within the scope of the present disclosure as well.

As such, each of the micro-strand heat dissipator connector holes 204 defined by base 202 of the processing device 200 may have a respective micro-strand heat dissipator element 300 coupled thereto, with the second micro-strand heat dissipator element portion 306 on each micro-strand heat dissipator element 300 extending into the base 202 from its top surface 202a, and the first micro-strand heat dissipator element portion 304 on each micro-strand heat dissipator element 300 extending from the top surface 202a of the base 202, as illustrated in FIG. 4D. Furthermore, the micro-strand heat dissipator elements 300 may be provided on the processing device 200 in a spaced apart, rectangular configuration that corresponds to the configuration of the micro-strand heat dissipator connector holes 204 and that provides a 13×15 grid of micro-strand heat dissipator elements 300 extending from the top surface 202a of the processing device 200.

Figure 4E:
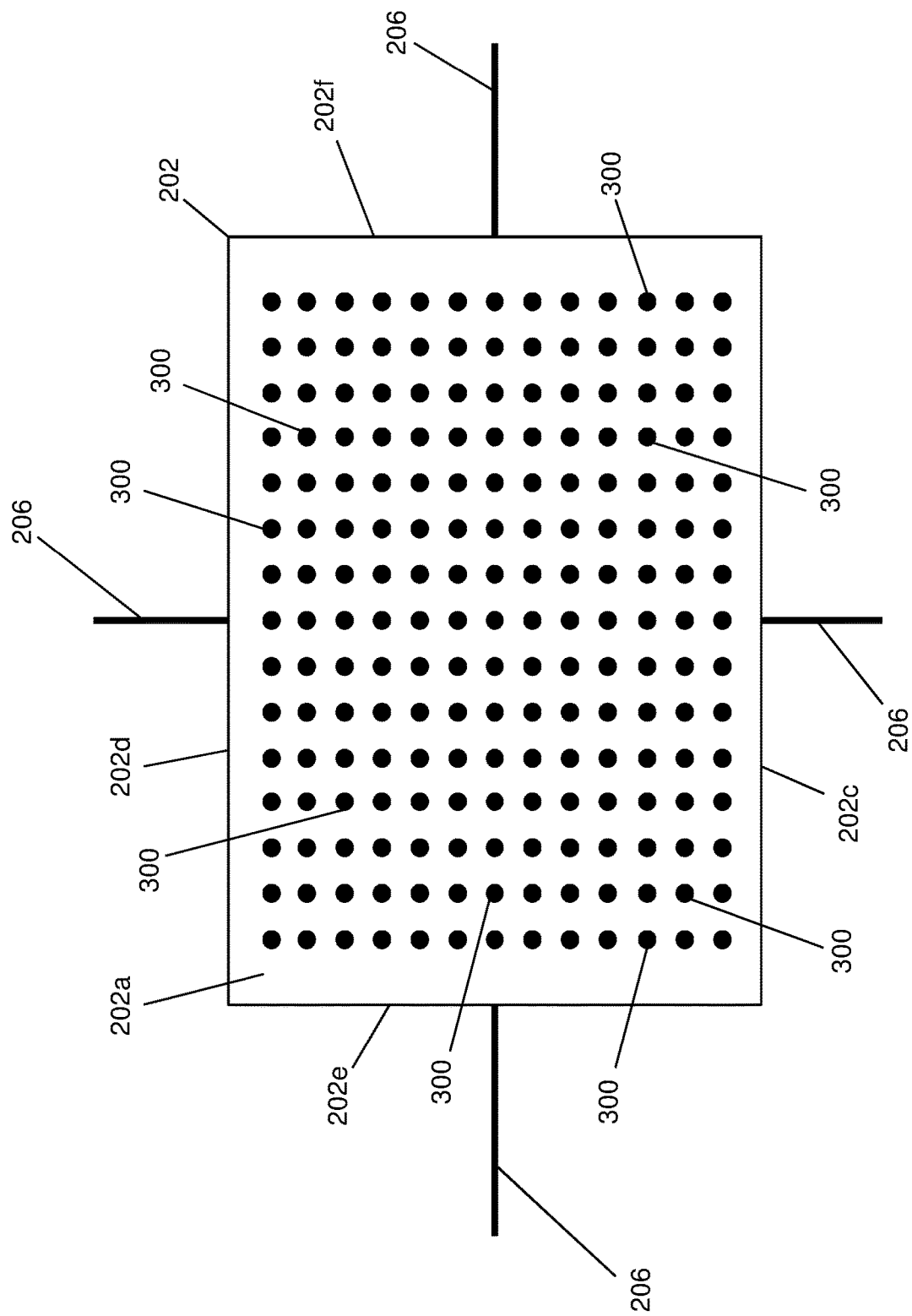
FIG. 4E is a schematic top view illustrating an embodiment of the plurality of micro-strand heat dissipation elements of FIG. 4A connected to the processing device of FIGS. 2A and 2B.

However, while discussed above with reference to FIGS. 4A-4E as being provided by the connection/securing of the micro-strand heat dissipator elements 300 to the micro-strand heat dissipator connector holes 204 defined by the base 202 of the processing device 200, in other embodiments the micro-strand heat dissipator connector features/holes 204 may be omitted, and the micro-strand heat dissipator elements 300 may be integrated with the processing device 200 in the configuration illustrated in FIGS. 4D and 4E during, for example, the manufacturing, fabrication, and/or other provisioning of the processing device 200. As such, one of skill in the art in possession of the present disclosure will appreciate that the micro-strand heat dissipator element configuration illustrated in FIGS. 4D and 4E may be provided on a processing device in a variety of manners that will fall within the scope of the present disclosure as well.

Figure 5A:
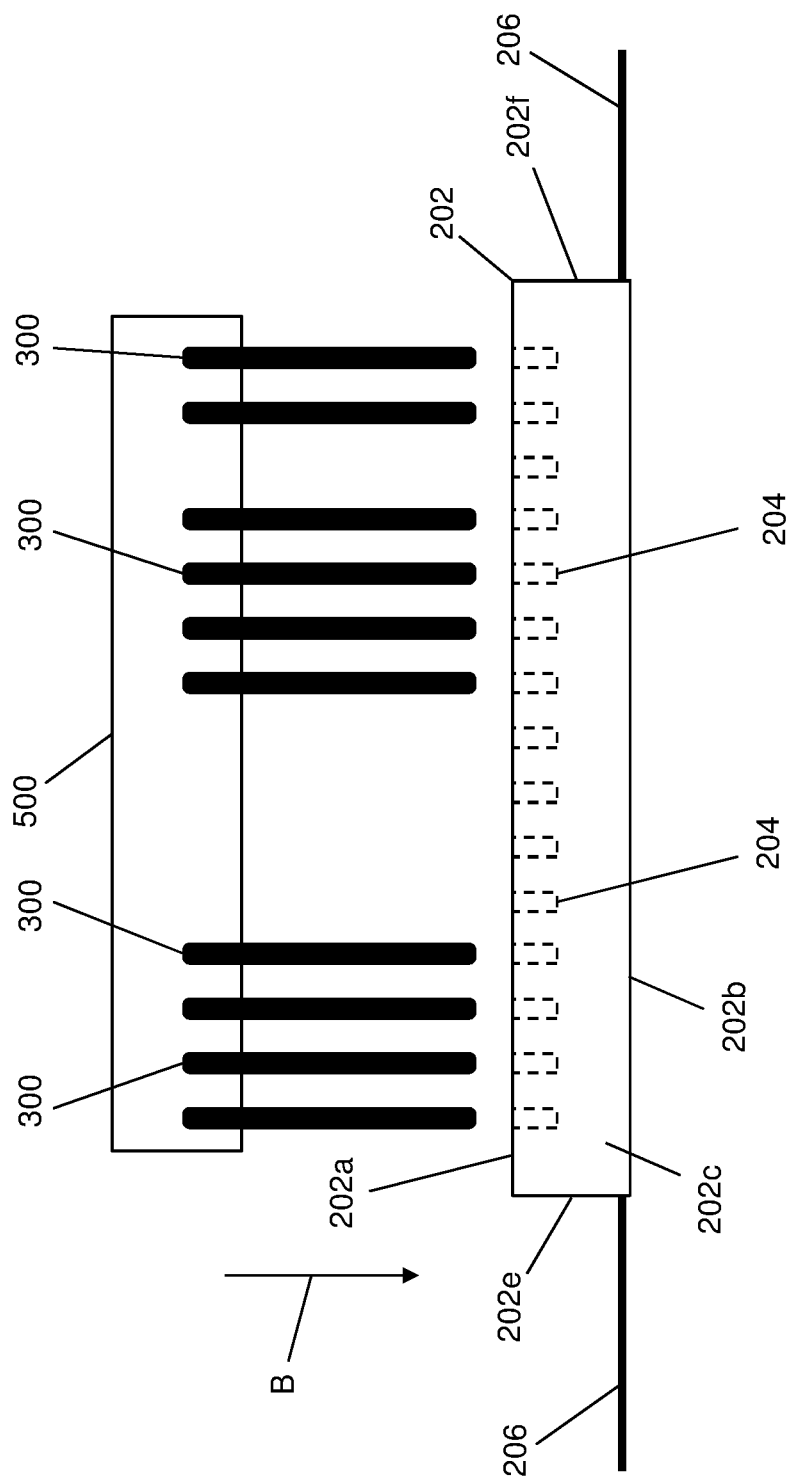
FIG. 5A is a schematic side view illustrating an embodiment of a plurality of the micro-strand heat dissipation elements of FIG. 3 being connected to the processing device of FIGS. 2A and 2B.
Figure 5B:
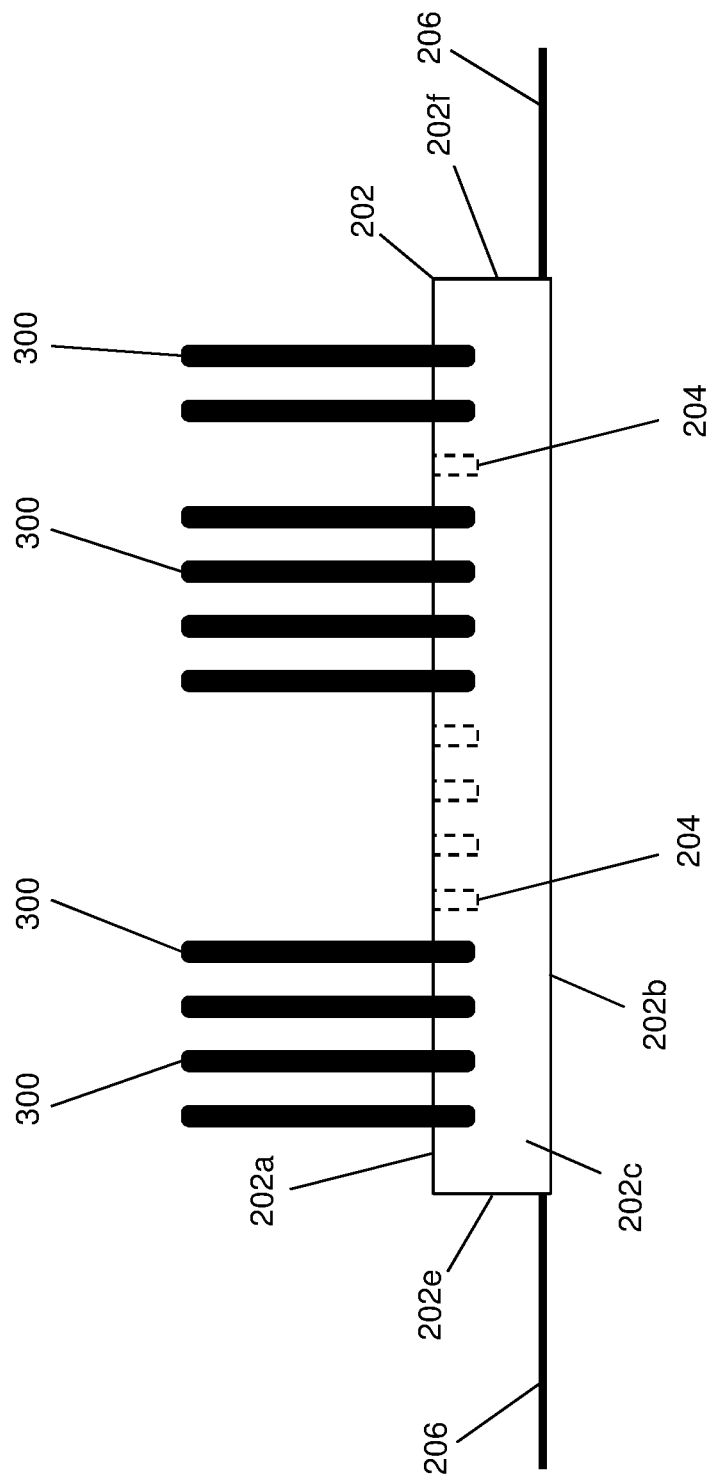
FIG. 5B is a schematic side view illustrating an embodiment of a plurality of the micro-strand heat dissipation elements of FIG. 3 connected to the processing device of FIGS. 2A and 2B.
Figure 5C:
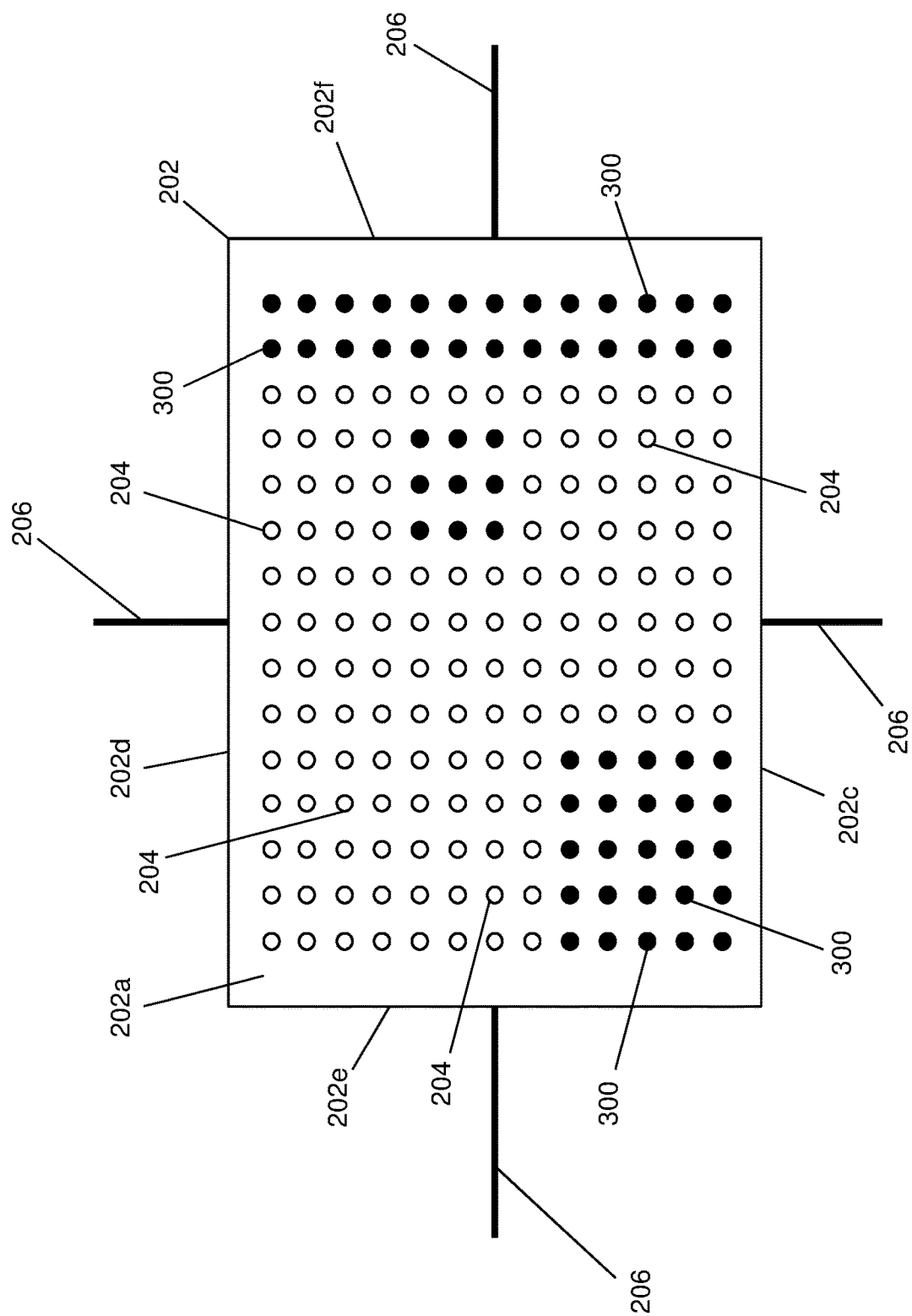
FIG. 5C is a schematic top view illustrating an embodiment of a plurality of the micro-strand heat dissipation elements of FIG. 3 connected to the processing device of FIGS. 2A and 2B.

With reference to FIGS. 5A, 5B, and 5C, another embodiment of the provisioning of the micro-strand heat dissipator elements 300 of the present disclosure on a processing device is illustrated. FIG. 5A illustrates a micro-strand heat dissipator element carrier 500 that is coupled to a plurality of the micro-strand heat dissipator elements 300 (e.g., to the top ends 302a of the base 302 on the micro-strand heat dissipator elements 300) and that positions the micro-strand heat dissipator elements 300 in a configuration that may correspond to a heat generation profile of the processing device to which those micro-strand heat dissipator elements 300 will be connected. In one example, the micro-strand heat dissipator element carrier 500 may be provided with the micro-strand heat dissipator elements 300 in the configuration illustrated in FIGS. 5A-5C based on expected heat production of processing device components in the base 202 of the processing device 200 (e.g., micro-strand heat dissipator elements 300 may be provided on the micro-strand heat dissipator element carrier 500 so that they may be connected/secured to the processing device 200 adjacent the highest heat generating components in the processing device 200). In another example, the processing device 200 may be tested to determine how heat is generated by the processing device 200 during its operations, and areas/volumes of the processing device 200 that generate relatively high amounts of heat during its operation may be identified. As will be appreciated by one of skill in the art in possession of the present disclosure, the identification of such a heat generation profile for the processing device 200 may allow the micro-strand heat dissipator element carrier 500 to be provided with the micro-strand heat dissipator elements 300 in the configuration that is illustrated in FIGS. 5A-5C and that correspond to the areas/volumes of the processing device 200 that generate relatively high amounts of heat during its operation. However, while two specific examples have been provided, the configuration of the micro-strand heat dissipator elements 300 in the micro-strand heat dissipator element carrier 500 may be determined in a variety of manners that will fall within the scope of the present disclosure as well.

FIG. 5A illustrates how the micro-strand heat dissipator element carrier 500 coupled to the plurality of the micro-strand heat dissipator elements 300 may be positioned adjacent the top surface 202a of the processing device 200 such that the micro-strand heat dissipator elements 300 are aligned with corresponding micro-strand heat dissipator connector holes 204 defined by the base 202 of the processing device 200. While not explicitly illustrated, one of skill in the art in possession of the present disclosure will appreciate that the micro-strand heat dissipator element carrier 500 may be coupled to the plurality of the micro-strand heat dissipator elements 300 in a variety of manners that allows the plurality of the micro-strand heat dissipator elements 300 to be released from the micro-strand heat dissipator element carrier 500 as discussed below.

As illustrated in FIGS. 5A and 5B, the micro-strand heat dissipator element carrier 500 coupled to the plurality of the micro-strand heat dissipator elements 300 may be moved in a direction B such that each of the micro-strand heat dissipator elements 300 extend into corresponding micro-strand heat dissipator connector holes 204. Similarly as discussed above, the plurality of the micro-strand heat dissipator elements 300 may then be released from the micro-strand heat dissipator element carrier 500, and the micro-strand heat dissipator element carrier 500 may be moved opposite the direction B. One of skill in the art in possession of the present disclosure will appreciate that the micro-strand heat dissipator elements 300 located in corresponding micro-strand heat dissipator connector holes 204 defined by the base 202 of the processing device 200 may be connected to the base 202 and/or secured in those micro-strand heat dissipator connector holes 204 using a variety of techniques. Similarly as discussed above, prior to positioning the micro-strand heat dissipator elements 300 in corresponding micro-strand heat dissipator connector holes 204, a heat conductive adhesive may be provided on the bottom end 302b of the micro-strand heat dissipator elements 300 and/or those micro-strand heat dissipator connector holes 204 defined by the base 202, and following the positioning the micro-strand heat dissipator elements 300 in corresponding micro-strand heat dissipator connector holes 204, the heat conductive adhesive may be allowed to dry to connect/secure the micro-strand heat dissipator elements 300 to corresponding micro-strand heat dissipator connector holes 204 defined by the base 202 of the processing device 200. However, in other embodiments, mechanical couplings and/or other coupling subsystems known in the art may be utilized to connect/secure the micro-strand heat dissipator elements 300 to corresponding micro-strand heat dissipator connector holes 204 defined by base 202 of the processing device 200 while remaining within the scope of the present disclosure as well.

As such, subsets of the micro-strand heat dissipator connector holes 204 defined by base 202 of the processing device 200 may have a respective micro-strand heat dissipator element 300 coupled thereto, with the second micro-strand heat dissipator element portion 306 on each of those micro-strand heat dissipator element 300 extending into the base 202 from the top surface 202a, and the first micro-strand heat dissipator element portion 304 on each of those micro-strand heat dissipator element 300 extending from the top surface 202a of the base 202, as illustrated in FIG. 5B. Furthermore, the micro-strand heat dissipator elements 300 may be provided on the processing device 200 in respective configurations that are illustrated as providing a 5×5 grid of micro-strand heat dissipator elements 300 extending from an area on the top surface 202a of the processing device 200, a 3×3 grid of micro-strand heat dissipator elements 300 extending from an area on the top surface 202a of the processing device 200, and a 13×2 grid of micro-strand heat dissipator elements 300 extending from an area on the top surface 202a of the processing device 200, which as discussed above may provided those micro-strand heat dissipator element grids immediately adjacent areas/volumes of the base 202 of the processing device 200 that are expected to (or known) to generate relatively high amounts of heat.

Figure 6A:
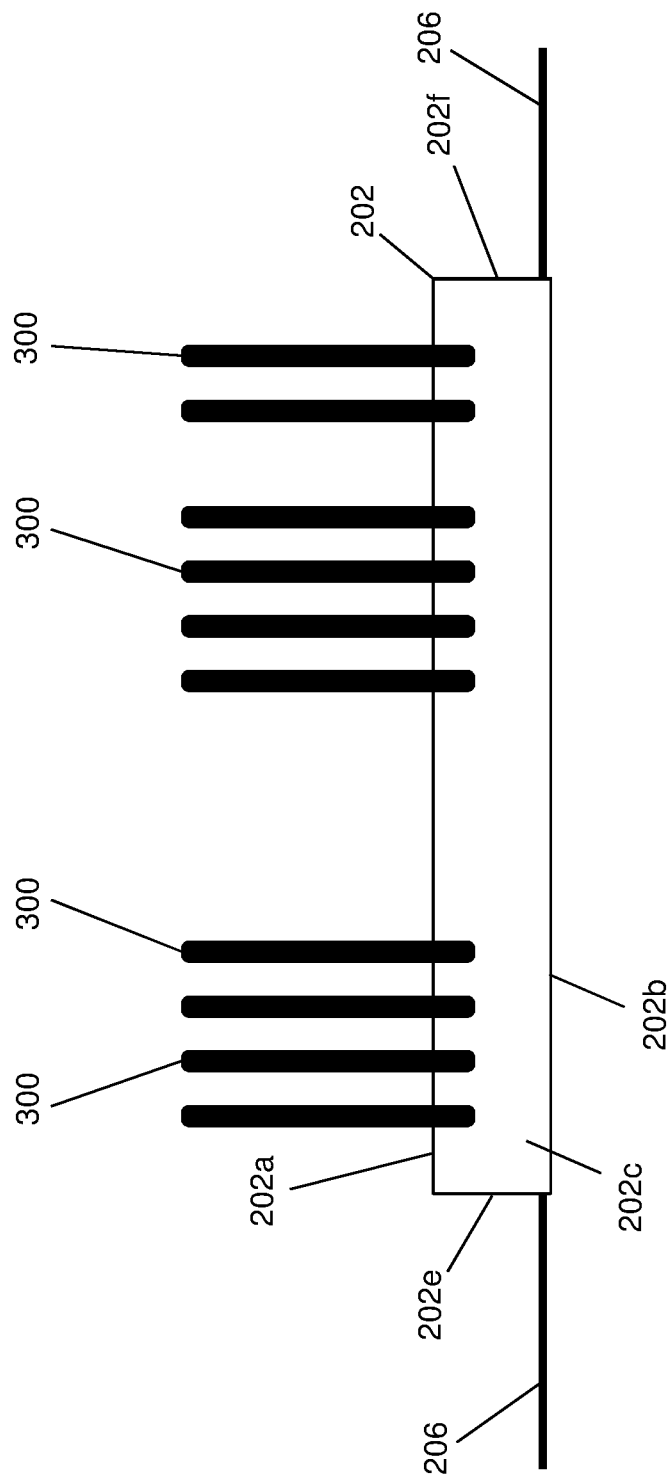
FIG. 6A is a schematic side view illustrating an embodiment of a plurality of the micro-strand heat dissipation elements of FIG. 3 integrated in a processing device.
Figure 6B:
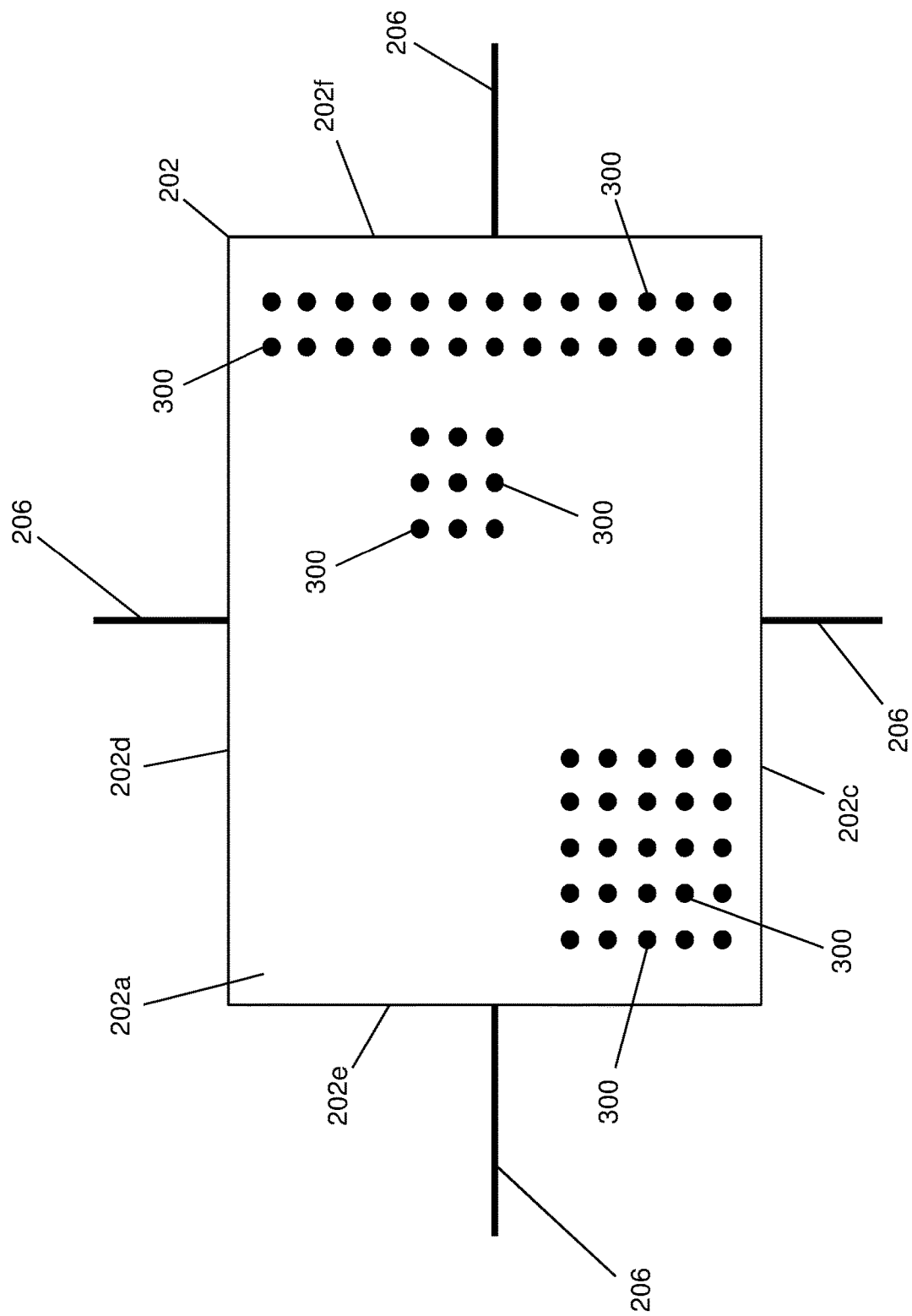
FIG. 6B is a schematic top view illustrating an embodiment of the processing device with the plurality of integrated micro-strand heat dissipation elements of FIG. 6A.

However, while discussed above with reference to FIGS. 5A-5C as being provided by the connection/securing of the micro-strand heat dissipator elements 300 to the micro-strand heat dissipator connector holes 204 defined by the base 202 of the processing device, FIGS. 6A and 6B illustrate how the micro-strand heat dissipator connector holes 204 may be omitted, and the micro-strand heat dissipator elements 300 may be integrated with the processing device 200 in the same configuration illustrated in FIGS. 5B and 5C during the manufacturing, fabrication, or other provisioning of the processing device 200. As such, one of skill in the art in possession of the present disclosure will appreciate that the micro-strand heat dissipator element configuration illustrated in FIGS. 5B and 5C may be provided in a variety of manners that will fall within the scope of the present disclosure as well.

Referring now to FIG. 7, an embodiment of a processing device 700 is illustrated that is similar to the processing device 200 discussed above with reference to FIGS. 2A and 2B, but with additional micro-strand heat dissipator connector features. As such, the processing device 700 is illustrated with similar reference numbers for elements that are shared with the processing device 200. In the specific example illustrated in FIG. 7, the additional micro-strand heat dissipator connector features are illustrated as a plurality of micro-strand heat dissipator connector holes 702 that are defined by the base 202 and that extend into the side surfaces 202e and 202f of the base 202. Furthermore, as discussed below, a plurality of micro-strand heat dissipator connector holes 702 may also extend into the base 202 from the front surface 202c and the rear surface 202d as well. Similarly as discussed above, the micro-strand heat dissipator connector holes 204 may be provided in any configuration and may extend different depths into the base 202 while remaining within the scope of the present disclosure as well. For example, micro-strand heat dissipator connector holes 204 may be provided only in areas on the outer surface of the base 202 that are known to become relatively hot during operation of the processing device 700, and may extend into the base 202 and adjacent heat producing components in the base 202 in order to maximize the amount of cooling provided by the micro-strand heat dissipation system of the present disclosure, discussed in further detail below.

However, while illustrated and described herein as provided by "holes" extending into the base 202 of the processing device 700, one of skill in the art in possession of the present disclosure will recognize that other types of micro-strand heat dissipator connector features may be provided with the processing device 700 to allow the micro-strand heat dissipator elements 300 to be connected to the processing device 700 in a variety of manners that will fall within the scope of the present disclosure as well. Furthermore, similarly as described above, in other embodiments the micro-strand heat dissipator elements of the present disclosure may be integrated as part of processing devices, and thus the micro-strand heat dissipator connector features discussed above may be omitted, and the processing devices utilizing the micro-strand heat dissipation system of the present disclosure may be manufactured, fabricated, or otherwise provisioned with micro-strand heat dissipator elements (i.e., rather than connecting the micro-strand heat dissipator elements to the processing device 700 via the micro-strand heat dissipator connector features as discussed above).

Figure 8A:
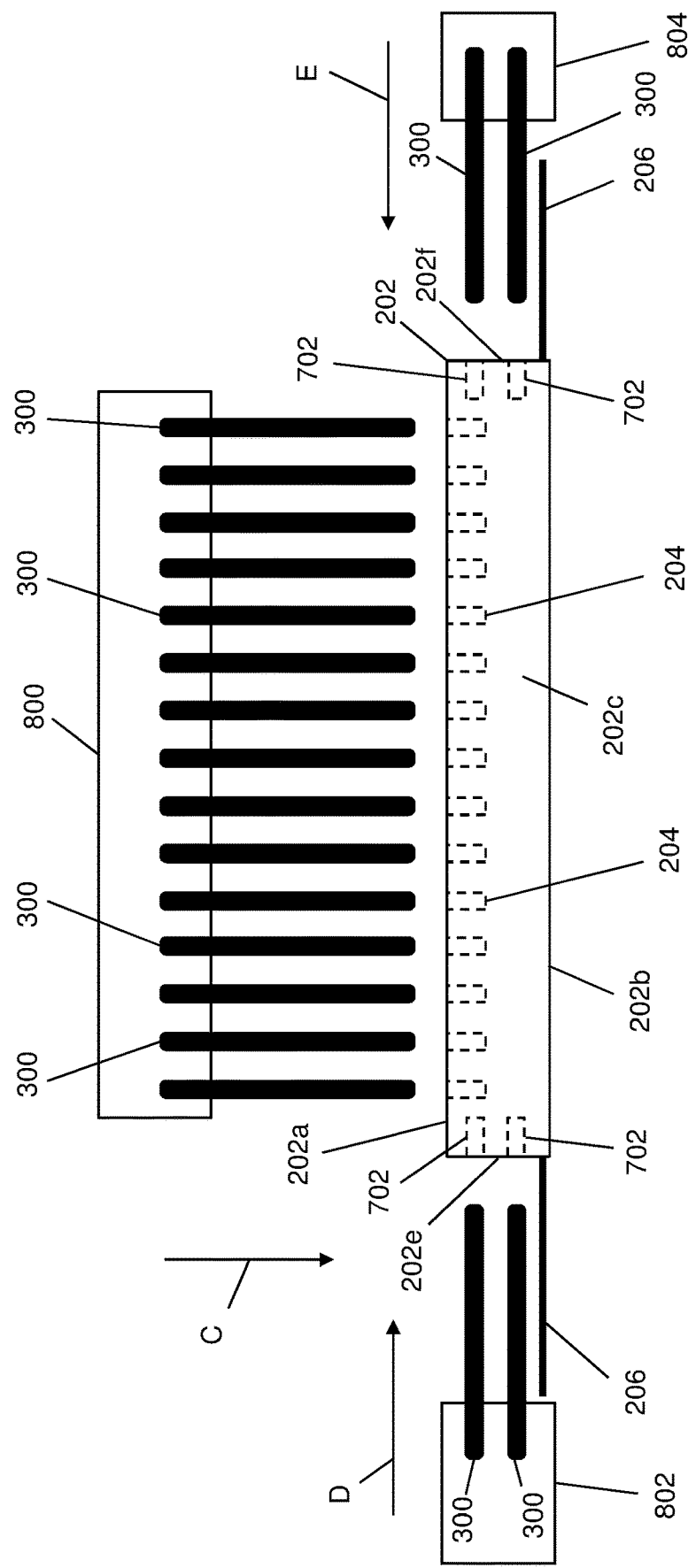
FIG. 8A is a schematic side view illustrating an embodiment of a plurality of the micro-strand heat dissipation elements of FIG. 3 being connected to the processing device of FIG. 7.
Figure 8B:
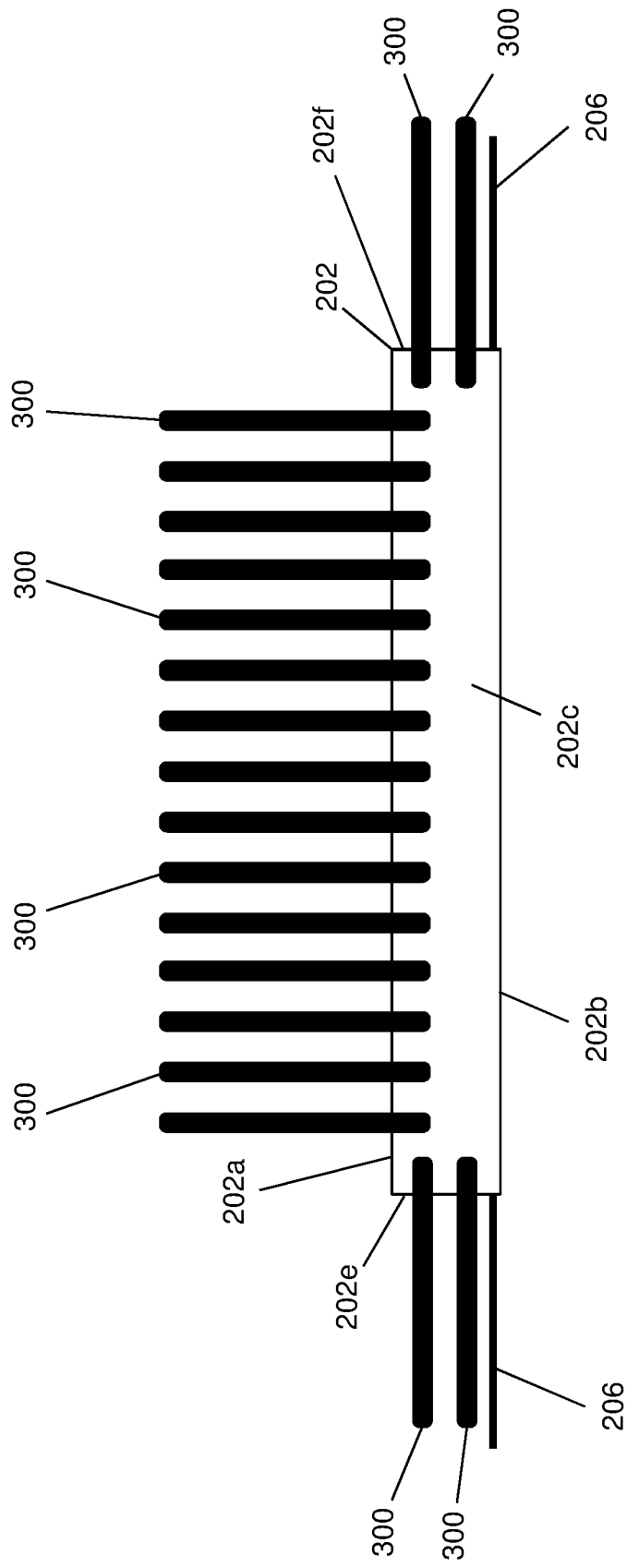
FIG. 8B is a schematic side view illustrating an embodiment of a plurality of the micro-strand heat dissipation elements of FIG. 3 connected to the processing device of FIG. 7.
Figure 8C:
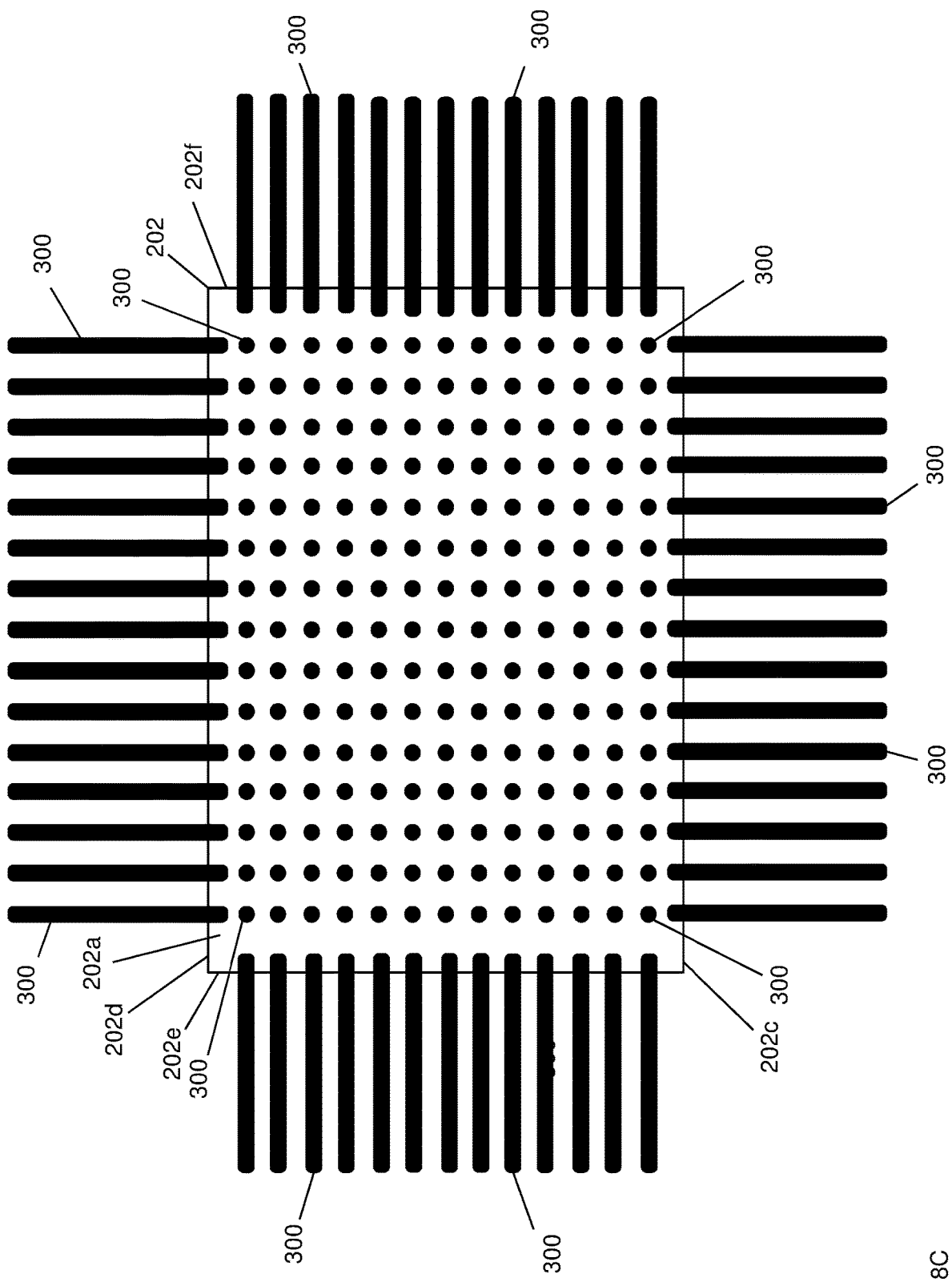
FIG. 8C is a schematic top view illustrating an embodiment of a plurality of the micro-strand heat dissipation elements of FIG. 3 connected to the processing device of FIG. 7.

With reference to FIGS. 8A, 8B, and 8C, another embodiment of the provisioning of the micro-strand heat dissipator elements 300 of the present disclosure on a processing device is illustrated. FIG. 8A illustrates a micro-strand heat dissipator element carrier 800 that is coupled to a plurality of the micro-strand heat dissipator elements 300 (e.g., to the top ends 302a of the base 302 on the micro-strand heat dissipator elements 300) and that positions those micro-strand heat dissipator elements 300 in a configuration that corresponds to the configuration of the micro-strand heat dissipator connector features on the processing device to which those micro-strand heat dissipator elements 300 will be connected, a micro-strand heat dissipator element carriers 802 that is coupled to a plurality of the micro-strand heat dissipator elements 300 (e.g., to the top ends 302a of the base 302 on the micro-strand heat dissipator elements 300) and that positions those micro-strand heat dissipator elements 300 in a configuration that corresponds to the configuration of the micro-strand heat dissipator connector features on the processing device to which those micro-strand heat dissipator elements 300 will be connected, and a micro-strand heat dissipator element carriers 804 that is coupled to a plurality of the micro-strand heat dissipator elements 300 (e.g., to the top ends 302a of the base 302 on the micro-strand heat dissipator elements 300) and that positions those micro-strand heat dissipator elements 300 in a configuration that corresponds to the configuration of the micro-strand heat dissipator connector features on the processing device to which those micro-strand heat dissipator elements 300 will be connected.

FIG. 8A illustrates how the micro-strand heat dissipator element carrier 800 coupled to the plurality of the micro-strand heat dissipator elements 300 is positioned adjacent the top surface 202a of the processing device 700 such that the micro-strand heat dissipator elements 300 are aligned with corresponding micro-strand heat dissipator connector holes 204 defined by the base 202 of the processing device 700. While not explicitly illustrated, one of skill in the art in possession of the present disclosure will appreciate that the micro-strand heat dissipator element carrier 800 may be coupled to the plurality of the micro-strand heat dissipator elements 300 in a variety of manners that allows the plurality of the micro-strand heat dissipator elements 300 to be released from the micro-strand heat dissipator element carrier 800 as discussed below.

FIG. 8A also illustrates how the micro-strand heat dissipator element carrier 802 coupled to the plurality of the micro-strand heat dissipator elements 300 is positioned adjacent the side surface 202e of the processing device 700 such that the micro-strand heat dissipator elements 300 are aligned with corresponding micro-strand heat dissipator connector holes 702 defined by the base 202 of the processing device 700. While not explicitly illustrated, one of skill in the art in possession of the present disclosure will appreciate that the micro-strand heat dissipator element carrier 802 may be coupled to the plurality of the micro-strand heat dissipator elements 300 in a variety of manners that allows the plurality of the micro-strand heat dissipator elements 300 to be released from the micro-strand heat dissipator element carrier 802 as discussed below.

FIG. 8A also illustrates how the micro-strand heat dissipator element carrier 804 coupled to the plurality of the micro-strand heat dissipator elements 300 is positioned adjacent the side surface 202f of the processing device 700 such that the micro-strand heat dissipator elements 300 are aligned with corresponding micro-strand heat dissipator connector holes 702 defined by the base 202 of the processing device 700. While not explicitly illustrated, one of skill in the art in possession of the present disclosure will appreciate that the micro-strand heat dissipator element carrier 804 may be coupled to the plurality of the micro-strand heat dissipator elements 300 in a variety of manners that allows the plurality of the micro-strand heat dissipator elements 300 to be released from the micro-strand heat dissipator element carrier 804 as discussed below. While not explicitly illustrated, one of skill in the art in possession of the present disclosure will appreciate how similar micro-strand heat dissipator element carriers coupled to micro-strand heat dissipator elements may be positioned adjacent the front surface 202c and the rear surface 202d of the base 202 on the processing device 200 as well.

As illustrated in FIGS. 8A and 8B, the micro-strand heat dissipator element carrier 800 coupled to the plurality of the micro-strand heat dissipator elements 300 may be moved in a direction C such that each of the micro-strand heat dissipator elements 300 extend into corresponding micro-strand heat dissipator connector holes 204, the plurality of the micro-strand heat dissipator elements 300 may then be released from the micro-strand heat dissipator element carrier 800, and the micro-strand heat dissipator element carrier 800 may be moved opposite the direction C. Similarly, the micro-strand heat dissipator element carrier 802 coupled to the plurality of the micro-strand heat dissipator elements 300 may be moved in a direction D such that each of the micro-strand heat dissipator elements 300 extend into corresponding micro-strand heat dissipator connector holes 702, the plurality of the micro-strand heat dissipator elements 300 may then be released from the micro-strand heat dissipator element carrier 802, and the micro-strand heat dissipator element carrier 802 may be moved opposite the direction D. Similarly as well, the micro-strand heat dissipator element carrier 804 coupled to the plurality of the micro-strand heat dissipator elements 300 may be moved in a direction E such that each of the micro-strand heat dissipator elements 300 extend into corresponding micro-strand heat dissipator connector holes 702, the plurality of the micro-strand heat dissipator elements 300 may then be released from the micro-strand heat dissipator element carrier 804, and the micro-strand heat dissipator element carrier 804 may be moved opposite the direction E.

Similarly as discussed above, the micro-strand heat dissipator elements 300 located in corresponding micro-strand heat dissipator connector holes 204/702 defined by the base 202 of the processing device 700 may be connected to the base 202 and/or secured in those micro-strand heat dissipator connector holes 204/702 using a variety of techniques. For example, prior to positioning the micro-strand heat dissipator elements 300 in corresponding micro-strand heat dissipator connector holes 204/702, a heat conductive adhesive may be provided on the bottom end 302b of the micro-strand heat dissipator elements 300 and/or those micro-strand heat dissipator connector holes 204/702 defined by the base 202, and may be allowed to dry to connect/secure the micro-strand heat dissipator elements 300 to corresponding micro-strand heat dissipator connector holes 204/702 defined by the base 202 of the processing device 700. However, in other embodiments, mechanical couplings and/or other coupling subsystems known in the art may be utilized to connect/secure the micro-strand heat dissipator elements 300 to corresponding micro-strand heat dissipator connector holes 204/702 defined by base 202 of the processing device 700 while remaining within the scope of the present disclosure as well.

As such, each of the micro-strand heat dissipator connector holes 204/702 defined by base 202 of the processing device 200 may have a respective micro-strand heat dissipator element 300 coupled thereto, with the second micro-strand heat dissipator element portion 306 on each of those micro-strand heat dissipator elements 300 extending into the base 202 from the top surface 202a, front surface 202c, rear surface 202d, and side surfaces 202e and 202f, and the first micro-strand heat dissipator element portion 304 on each of those micro-strand heat dissipator elements 300 extending from the top surface 202a, front surface 202c, rear surface 202d, and side surfaces 202e and 202f of the base 202, as illustrated in FIGS. 8B and 8C. However, while discussed above with reference to FIGS. 8A-8C as being provided by the connection/securing of the micro-strand heat dissipator elements 300 to the micro-strand heat dissipator connector holes 204/702 defined by the base 202 of the processing device 700, in some embodiments the micro-strand heat dissipator connector holes 204/702 may be omitted, and the micro-strand heat dissipator elements 300 may be integrated with the processing device 700 in the same configuration illustrated in FIGS. 8B and 8C during the manufacturing, fabrication, or other provisioning of the processing device 700. As such, one of skill in the art in possession of the present disclosure will appreciate that the micro-strand heat dissipator element configuration illustrated in FIGS. 8B and 8C may be provided in a variety of manners that will fall within the scope of the present disclosure as well.

Figure 9A:
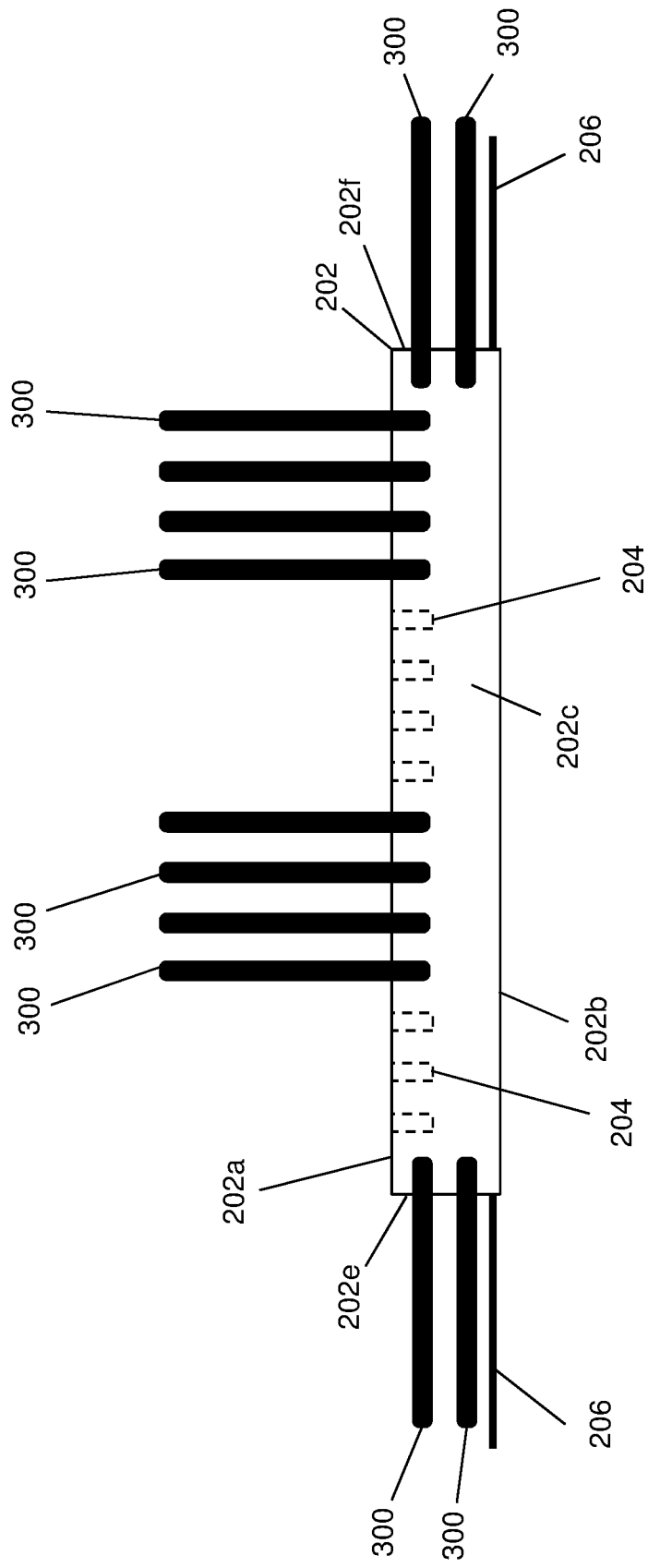
FIG. 9A is a schematic side view illustrating an embodiment of a plurality of the micro-strand heat dissipation elements of FIG. 3 connected to the processing device of FIG. 7.
Figure 9B:
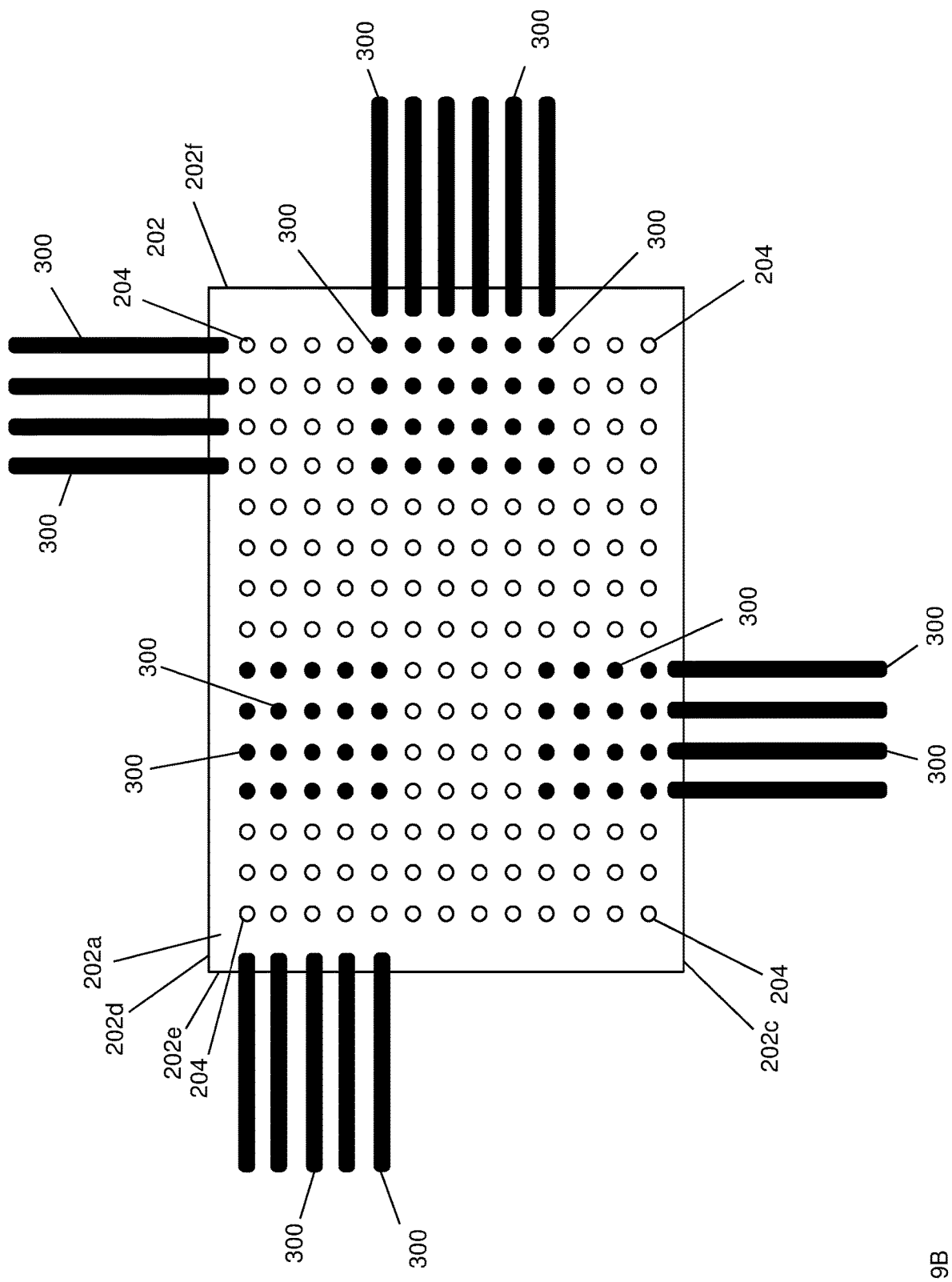
FIG. 9B is a schematic top view illustrating an embodiment of a plurality of the micro-strand heat dissipation elements of FIG. 3 connected to the processing device of FIG. 7.
Figure 10:
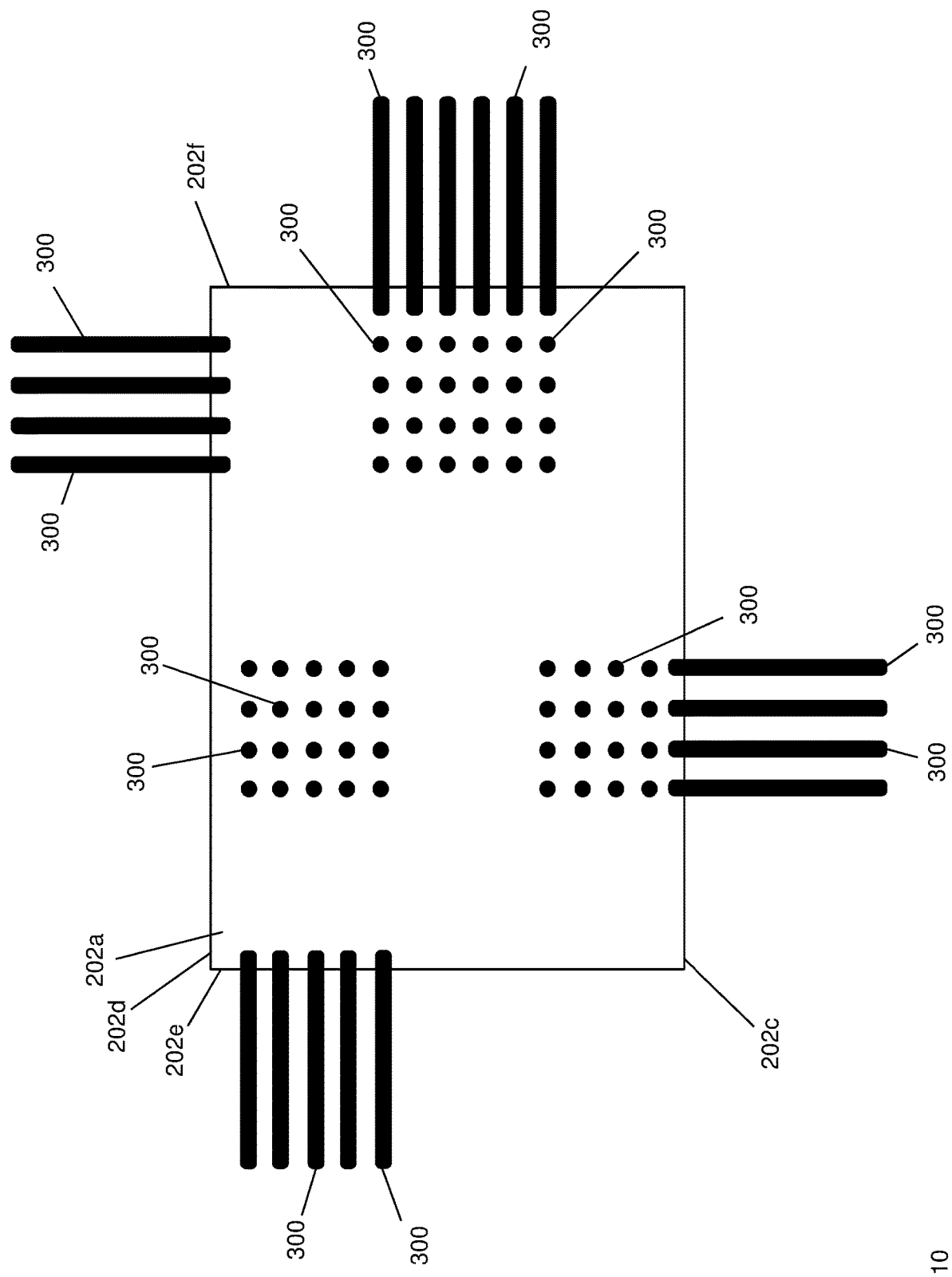
FIG. 10 is a schematic top view illustrating an embodiment of a plurality of the micro-strand heat dissipation elements of FIG. 3 integrated in a processing device.

Referring now to FIGS. 9A and 9B, an embodiment of the processing system 700 is illustrated with micro-strand heat dissipator elements 300 connected/secured to subsets of its micro-strand heat dissipator connector holes 204/702 in a manner similar to that described above with reference to FIGS. 5A-5C. As such, micro-strand heat dissipator elements 300 may be connected/secured to subsets of the micro-strand heat dissipator connector holes 204/702 on the processing device 700 using micro-strand heat dissipator element carriers that are similar to the micro-strand heat dissipator carrier 500 of FIG. 5A, and that are populated with micro-strand heat dissipator elements 300 based on the expected (or known) heat generation of the processing device 700. Similarly, FIG. 10 illustrates how the micro-strand heat dissipator connector holes 204/702 may be omitted from the processing device 700, and the micro-strand heat dissipator elements 300 may be integrated with processing device 700 during its manufacture in the same configuration as illustrated in FIGS. 9A and 9B.

Referring now to FIG. 11A, an embodiment of a stacked processing system 1100 is illustrated that includes a plurality of processing devices 1102, 1104, 1106, 1108, and 1110 in a stacked processing system configuration. As will be appreciated by one of skill in the art in possession of the present disclosure, the processing device 1102 may be substantially similar to the processing system 700 based on its inclusion of micro-strand heat dissipator connector holes 1102a extending into its top surface and side surfaces, while the processing devices 1104, 1106, 1108, and 1110 may be substantially similar to the processing system 700 based on their inclusion of respective micro-strand heat dissipator connector holes 1104a, 1106a, 1108a, and 1110a extending into their side surfaces. Furthermore, one of more processing device coupling elements 1112 may extend from the processing devices 1102, 1104, 1106, 1108, and 1110, and one of skill in the art in possession of the present disclosure will recognize how the processing device coupling elements 1112 may be provided by any processing device/integrated circuit couplings that allow the processing devices 1102, 1104, 1106, 1108, and 1110 to be coupled to other components (e.g., via a circuit board or other coupling medium known in the art.) However, while a specific stacked processing system 1100 has been illustrated and described, one of skill in the art in possession of the present disclosure will recognize that the micro-strand heat dissipation system of the present disclosure may include a variety of components and component configurations while remaining within the scope of the present disclosure as well.

Figure 11B:
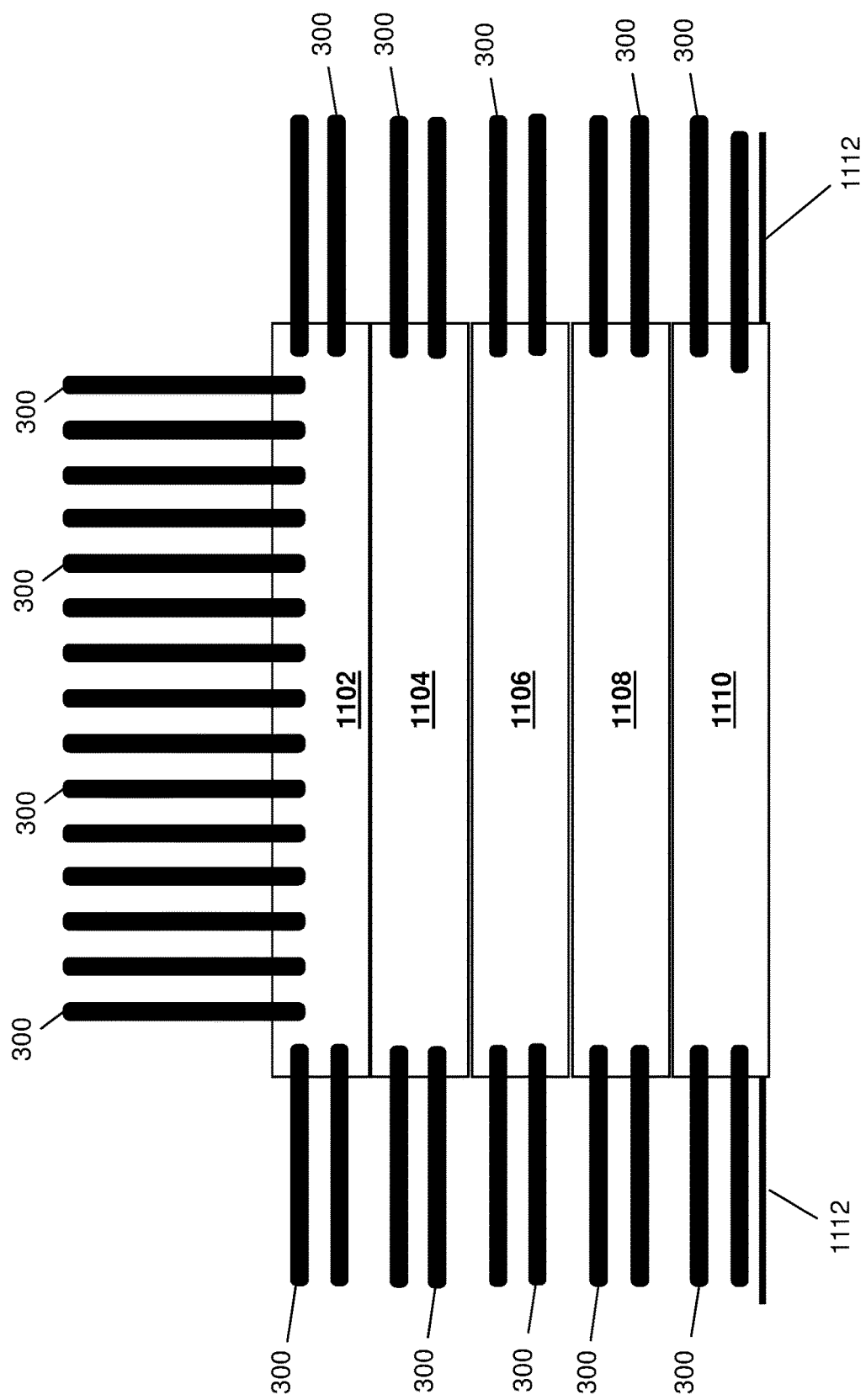
FIG. 11B is a schematic side view illustrating an embodiment of a plurality of the micro-strand heat dissipation elements of FIG. 3 connected to the stacked processing system of FIG. 11A.

With reference to FIG. 11B, an embodiment of the stack processing system 1100 is illustrated that includes micro-strand heat dissipator elements 300 connected/secured in each of the micro-strand heat dissipator connector holes 1102a, 1104a, 1106a, 1108a, and 1110a included on the stacked processing system 1100, and one of skill in the art in possession of the present disclosure will appreciate that the micro-strand heat dissipator elements 300 may be connected to each of the micro-strand heat dissipator connector holes 1102a, 1104a, 1106a, 1108a, and 1110a in substantially the same manner as described above with reference to FIGS. 4A-4E and/or 8A-8C.

Figure 12:
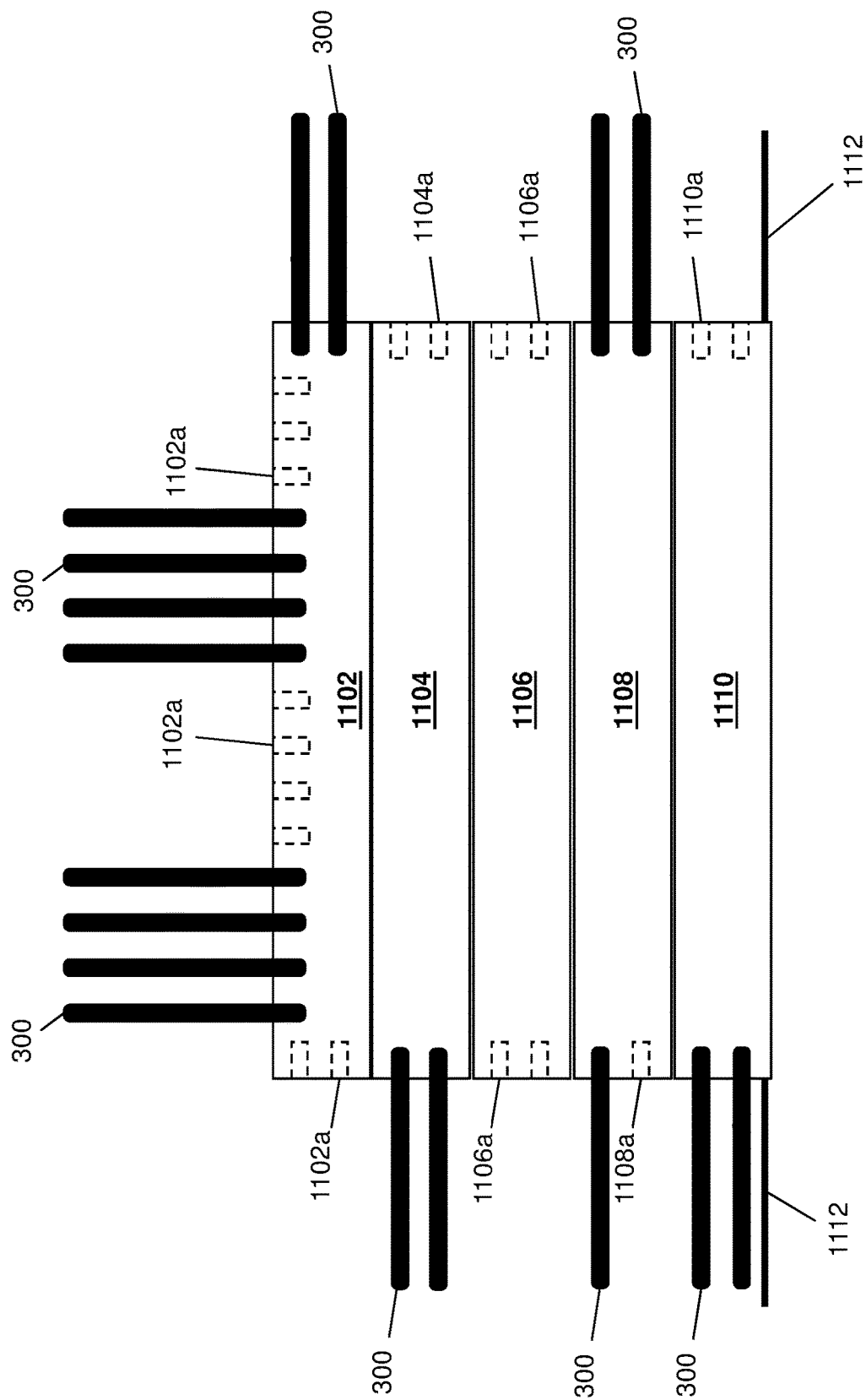
FIG. 12 is a schematic side view illustrating an embodiment of a plurality of the micro-strand heat dissipation elements of FIG. 3 connected to the stacked processing system of FIG. 11A.
Figure 13:
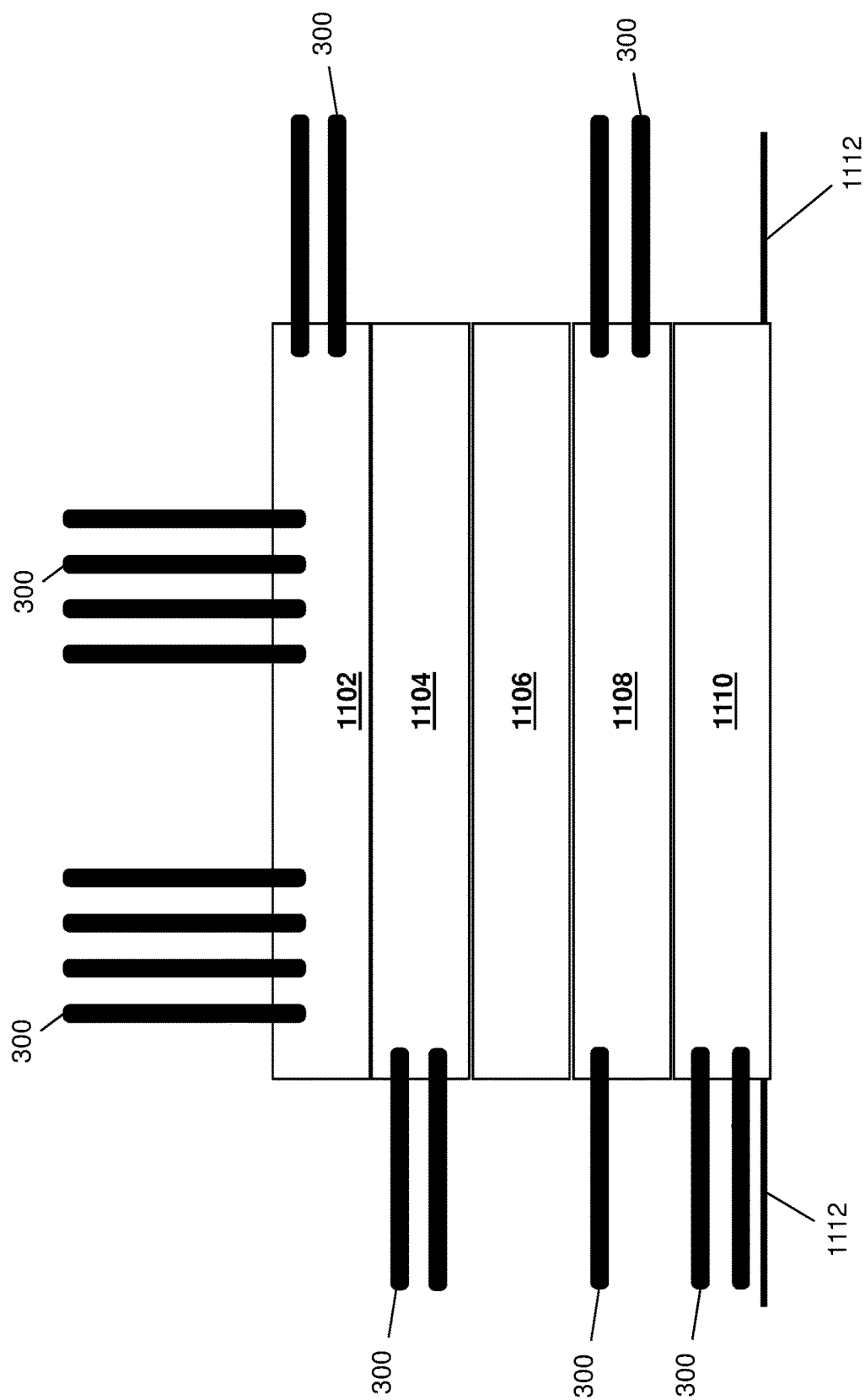
FIG. 13 is a schematic side view illustrating an embodiment of a plurality of the micro-strand heat dissipation elements of FIG. 3 integrated in a stacked processing system.

With reference to FIG. 12, an embodiment of the stack processing system 1100 is illustrated that includes micro-strand heat dissipator elements 300 connected/secured in subsets of the micro-strand heat dissipator connector holes 1102a, 1104a, 1106a, 1108a, and 1110a included on the stacked processing system 1100, and one of skill in the art in possession of the present disclosure will appreciate that the micro-strand heat dissipator elements 300 may be connected to each of the micro-strand heat dissipator connector holes 1102a, 1104a, 1106a, 1108a, and 1110a in substantially the same manner as described above with reference to FIGS. 5A-5C and/or 9A and 9B. Similarly, FIG. 13 illustrates how the micro-strand heat dissipator connector holes 1102a, 1104a, 1106a, 1108a, and 1110a may be omitted from the stacked processing system 1100, and the micro-strand heat dissipator elements 300 may be integrated with stacked processing system 1100 during its manufacture, fabrication, or other provisioning in the same configuration as illustrated in FIG. 12.

Figure 14:
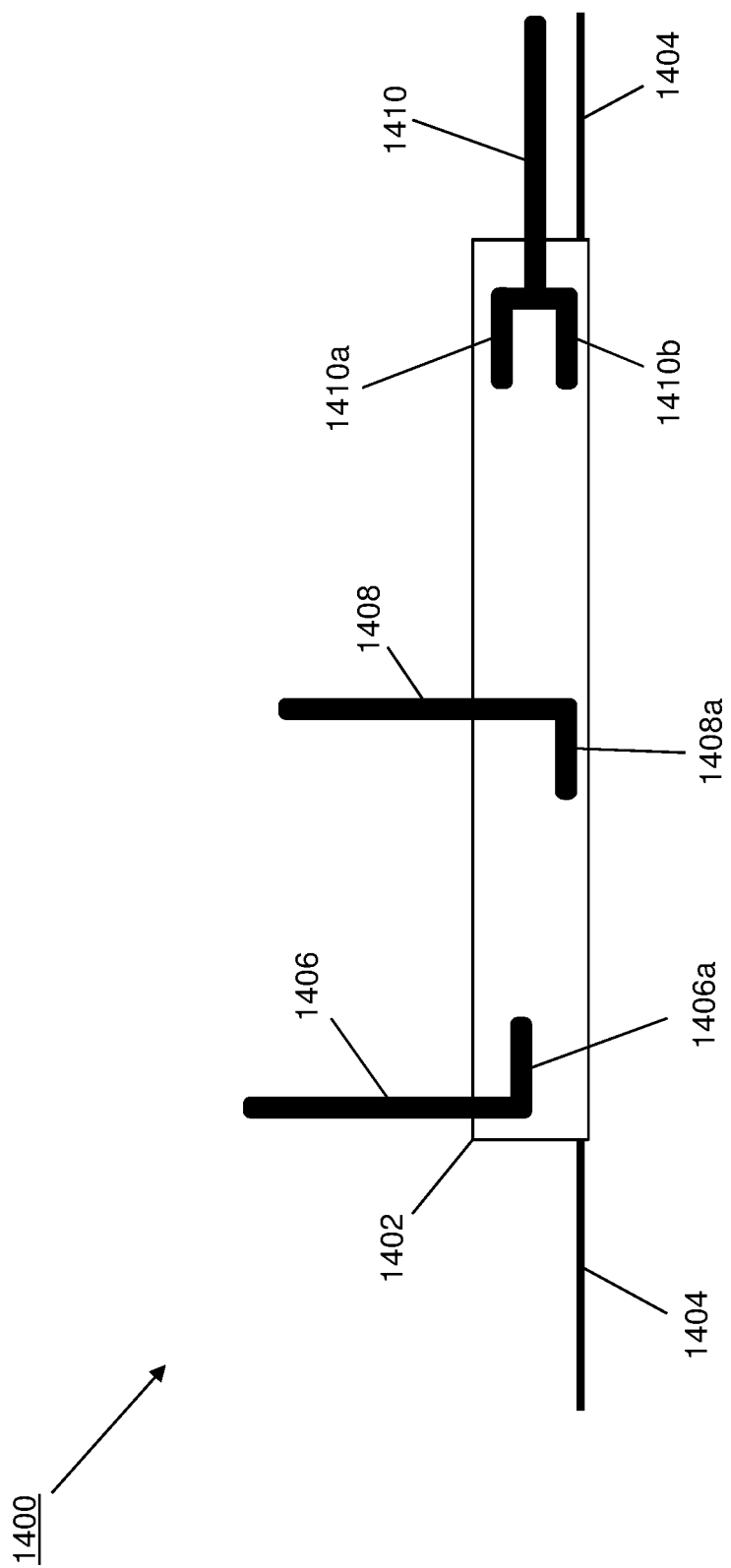
FIG. 14 is a schematic side view illustrating an embodiment of a plurality of the micro-strand heat dissipation elements of FIG. 3 integrated in a processing device.

Referring now to FIG. 14, an embodiment of a processing device 1400 is illustrated that may include integrated micro-strand heat dissipator elements that provide the micro-strand heat dissipation system of the present disclosure. As illustrated, the processing device 1400 includes a base 1402 with a plurality of processing device coupling elements 1404 extending from the outer surface of the base 1400. Furthermore, a micro-strand heat dissipator element 1406 is illustrated that includes a first micro-strand heat dissipator element portion that extends from the outer surface of the base 1402, and that includes a second micro-strand heat dissipator element portion 1406a that extends into the base 1402 from its outer surface and that is oriented substantially perpendicularly to the first micro-strand heat dissipator element portion of the micro-strand heat dissipator element 1406 that extends from the outer surface of the base 1402. Similarly, a micro-strand heat dissipator element 1408 is illustrated and includes a first micro-strand heat dissipator element portion that extends from the outer surface of the base 1402, and that includes a micro-strand heat dissipator element portion 1408a that extends into the base 1402 from its outer surface and that is oriented substantially perpendicularly to the first micro-strand heat dissipator element portion of the micro-strand heat dissipator element 1408 that extends from the outer surface of the base 1402.

Similarly as well, a micro-strand heat dissipator element 1410 is illustrated that includes a first micro-strand heat dissipator element portion that extends from the outer surface of the base 1402, and that includes a pair of micro-strand heat dissipator element portions 1410a and 1410b that extend into the base 1402 from its outer surface and that are oriented substantially parallel to the first micro-strand heat dissipator element portion of the micro-strand heat dissipator element 1408 that extends from the outer surface of the base 1402 but in different planes than the first micro-strand heat dissipator element portion of the micro-strand heat dissipator element 1408 that extends from the outer surface of the base 1402. As will be appreciated by one of skill in the art in possession of the present disclosure, the micro-strand heat dissipator element portion 1406a, 1408a, 1410a, and 1410b may be routed to locations in the base 1402 where heat generation is expected or known to occur, which allows the first micro-strand heat dissipator element portions of their respective micro-strand heat dissipator elements 1406, 1408, and 1410 that extend from the outer surface of the base 1402 to dissipate that heat more efficiently.

Figure 15:
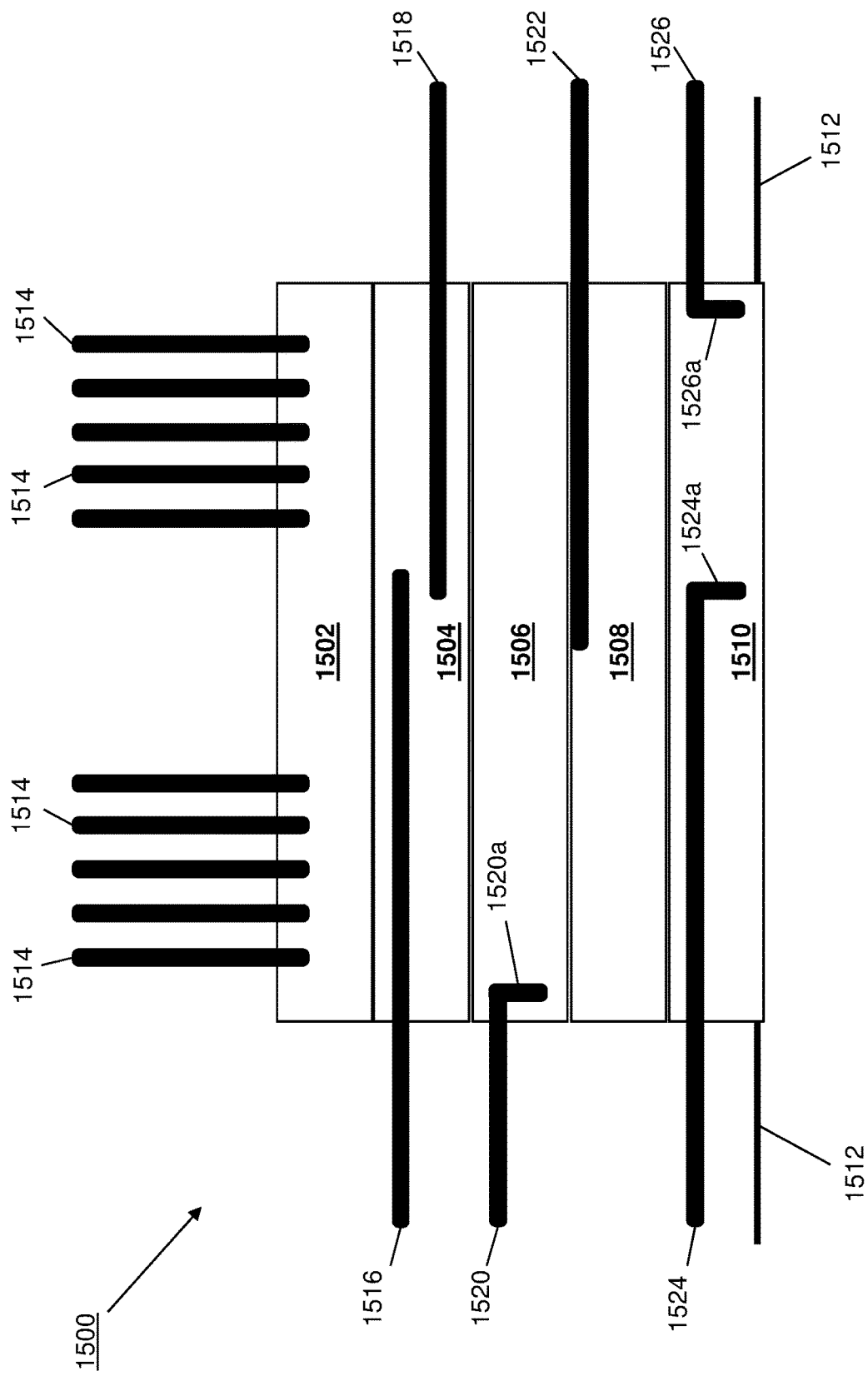
FIG. 15 is a schematic side view illustrating an embodiment of a plurality of the micro-strand heat dissipation elements of FIG. 3 integrated in a stacked processing system.

Referring now to FIG. 15, an embodiment of a stacked processing system 1500 is illustrated that may include integrated micro-strand heat dissipator elements that provide the micro-strand heat dissipation system of the present disclosure. As illustrated, the stacked processing system 1500 includes processing devices 1502, 1504, 1506, 1508, and 1510 in a stacked processing system orientation and with a plurality of processing device coupling elements 1512 extending from the outer surface of the base processing device 1510. Furthermore, a plurality of micro-strand heat dissipator elements 1514 are illustrated that extend from the outer surface of the processing device 1502, with each micro-strand heat dissipator elements 1514 extending into the processing device 1502 and out of the processing device 1502 substantially the same distance. Similarly, a pair of micro-strand heat dissipator elements 1516 and 1518 are illustrated that extend from opposing outer surfaces of the processing device 1504, and that extend different distances into the processing device 1504.

Similarly as well, a micro-strand heat dissipator element 1520 is illustrated that includes a first micro-strand heat dissipator element portion that extends from the outer surface of the processing device 1506, and that includes a second micro-strand heat dissipator element portion 1520a that extends into the processing device 1506 from its outer surface and that is oriented substantially perpendicular to the first micro-strand heat dissipator element portion of the micro-strand heat dissipator element 1520 that extends from the outer surface of the processing device 1506. Similarly as well, a micro-strand heat dissipator element 1522 is illustrated that extends from the outer surface of the processing device 1508, and that extends into the processing device 1506 from its outer surface. Similarly as well, micro-strand heat dissipator elements 1524 and 1526 are illustrated that include first micro-strand heat dissipator element portions that extend from the outer surface of the processing device 1510, and that include respective micro-strand heat dissipator element portions 1524a and 1516a that extend into the processing device 1510 from its outer surface and that are oriented substantially perpendicular to the first micro-strand heat dissipator element portions of the respective micro-strand heat dissipator elements 1524 and 1526 that extend from the outer surface of the processing device 1510. As will be appreciated by one of skill in the art in possession of the present disclosure, the portions of the micro-strand heat dissipator elements 1514, 1515, 1518, 1520, 1522, 1524, and 1526 that extend into the processing devices in the stacked processing system 1500 may be routed to locations in the stacked processing system 1500 where heat generation is expected or known to occur, which allows those micro-strand heat dissipator elements 1514, 1515, 1518, 1520, 1522, 1524, and 1526 to dissipate that heat more efficiently.

Referring now to FIG. 16, an embodiment of a method 1600 for dissipating heat is illustrated. As discussed below, the systems and methods of the present disclosure provide for the dissipation of heat from a processing device via the use of micro-strand heat dissipator elements. For example, a plurality of micro-strand heat dissipator elements may each be positioned on the processing device in a spaced apart orientation from the other micro-strand heat dissipator elements, with each micro-strand heat dissipator element including a first micro-strand heat dissipator element portion that extends into the processing device from an outer surface of the processing device, and a second micro-strand heat dissipator element portion that extends from the outer surface of the processing device. As such, heat generated by the processing device may be conducted by the first micro-strand heat dissipator element portion of at least some of the micro-strand heat dissipator elements to the second micro-strand heat dissipator element portions of those micro-strand heat dissipator elements, and then dissipated by the second micro-strand heat dissipator element portions of those micro-strand heat dissipator elements. It has been found that the use of micro-strand heat dissipator elements allows for targeted dissipation of heat generated from particular areas or volumes in the processing device, and may operate to meet the cooling requirements of relatively higher performance processing devices such as those provided by silicon photonics integrated circuits.

The method 1600 begins at block 1602 where a processing device generates heat. In an embodiment, at block 1602, any of the processing devices discussed above may operate to generate heat. For example, processing devices utilizing the micro-strand heat dissipation system of the present disclosure may be provided by silicon photonics integrated circuits, and the operation of components in those processing devices will product heat. In particular one of skill in the art in possession of the present disclosure will recognize how the operation of components in processing devices provided by silicon photonics integrated circuits may result in particular areas (e.g., as viewed from a top surface of the processing device) or volumes of the processing device that generate heat and reach relatively high temperatures (as opposed to other areas or volumes of the processing device that do not include such components and, as such, do not generate as much heat and, as such, reach relatively lower temperatures). However, while a specific processing device is discussed, one of skill in the art in possession of the present disclosure will appreciate how uniform or non-uniform heat generation by any of a variety of devices may utilize the micro-strand heat dissipation system of the present disclosure while remaining within its scope.

The method 1600 then proceeds to block 1604 where a first micro-strand heat dissipator element portion of micro-strand heat dissipator elements conducts heat to a second micro-strand heat dissipator element portion of the micro-strand heat dissipator elements. In an embodiment, at block 1604, the first micro-strand heat dissipator element portion of at least some of the micro-strand heat dissipator elements that extends into the processing device will operate to conduct the heat generated by the processing device at block 1602 to the corresponding second micro-strand heat dissipator element portion of those micro-strand heat dissipator elements that extend out of the surface of the processing device, and one of skill in the art in possession of the present disclosure will appreciate that micro-strand heat dissipator elements positioned closer to the source of heat generation within the processing device may conduct more heat relative to micro-strand heat dissipator elements positioned further from the source of heat generation within the processing device. As discussed in detail above, the second micro-strand heat dissipator element portion of the micro-strand heat dissipator elements may extend into the processing device to an area or volume that is expected or known to generated relatively high temperatures, and thus the configuration of the micro-strand heat dissipator elements on the processing device may be designed to maximize the heat transfer from the processing device at block 1604. At will be appreciated by one of skill in the art in possession of the present disclosure, the micro-strand heat dissipator elements in the processing system stacks described above with reference to FIGS. 11A, 11B, 12, 13, and 15 may operate similarly as discussed above to conduct heat generated by any of the processing devices included in those processing system stacks.

The method 1600 then proceeds to block 1606 where the second micro-strand heat dissipator element portion of the micro-strand heat dissipator elements dissipates the heat. In an embodiment, at block 1606, the heat conducted to the second micro-strand heat dissipator element portion of the micro-strand heat dissipator elements will then be dissipated by the second micro-strand heat dissipator element portion of those micro-strand heat dissipator elements. As will be appreciated by one of skill in the art in possession of the present disclosure, the heat conducted to the second micro-strand heat dissipator element portion of those micro-strand heat dissipator elements may be dissipated at block 1606 via radiative heat transfer, as well as convective heat transfer. As will be appreciated by one of skill in the art in possession of the present disclosure, the configuration of the micro-strand heat dissipator elements may allow air (or other fluids) to move past the second micro-strand heat dissipator element portion of those micro-strand heat dissipator elements in different directions (i.e., rather than blocking airflow in some directions, as occurs in many "finned" heat sink systems) in order to enhance the convective heat transfer from those micro-strand heat dissipator elements. As such, heat generated by the processing device (or devices) may be dissipated by the micro-strand heat dissipator elements extending from that processing device.

Thus, systems and methods have been described that provide for the dissipation of heat from a silicon photonics integrated circuit via the use of micro-strand heat dissipator elements. For example, a plurality of micro-strand heat dissipator elements may each be positioned on the silicon photonics integrated circuit in a spaced apart orientation from the other micro-strand heat dissipator elements, with each micro-strand heat dissipator element including a first micro-strand heat dissipator element portion that extends into the silicon photonics integrated circuit from an outer surface of the silicon photonics integrated circuit, and a second micro-strand heat dissipator element portion that extends from the outer surface of the silicon photonics integrated circuit. As such, heat generated by the silicon photonics integrated circuit may be conducted by the first micro-strand heat dissipator element portion of at least some of the micro-strand heat dissipator elements to the second micro-strand heat dissipator element portions of those micro-strand heat dissipator elements, and then dissipated by the second micro-strand heat dissipator element portions of those micro-strand heat dissipator elements. It has been found that the use of micro-strand heat dissipator elements allows for targeting dissipation of heat generated from particular areas or volumes in the silicon photonics integrated circuit, and may operate to meet the cooling requirements of silicon photonics integrated circuits.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A micro-strand heat dissipation system, comprising:
a first processing device;
a plurality of first micro-strand heat dissipator elements that are each positioned on the first processing device in a spaced apart orientation from the other first micro-strand heat dissipator elements, wherein each of the plurality of first micro-strand heat dissipator elements include:
a first micro-strand heat dissipator element portion that extends into the first processing device from an outer surface of the first processing device; and
a second micro-strand heat dissipator element portion that extends from the outer surface of the first processing device.

2. The system of claim 1, wherein the first processing device includes:
a plurality of micro-strand heat dissipator connector features that are each accessible on the outer surface of the first processing device in a spaced apart orientation from the other micro-strand heat dissipator connector features, wherein each of the plurality of first micro-strand heat dissipator elements are connected to a respective micro-strand heat dissipator connector feature.

3. The system of claim 1, wherein the plurality of first micro-strand heat dissipator elements are integrated as part of the first processing device.

4. The system of claim 1, wherein:
the outer surface of the first processing device includes a first outer surface and a second outer surface that is oriented substantially perpendicularly to the first outer surface;
each of a first subset of the plurality of first micro-strand heat dissipator elements extend from the first outer surface of the first processing device; and
each of a second subset of the plurality of first micro-strand heat dissipator elements extend from the second outer surface of the first processing device.

5. The system of claim 1, further comprising:
a second processing device that is coupled to the first processing device in a stacked processing system configuration;
a plurality of second micro-strand heat dissipator elements that are each positioned on the second processing device in a spaced apart orientation from the other second micro-strand heat dissipator elements, wherein each of the plurality of second micro-strand heat dissipator elements include:
a first micro-strand heat dissipator element portion that extends into the second processing device from the outer surface of the second processing device; and
a second micro-strand heat dissipator element portion that extends from the outer surface of the second processing device.

6. The system of claim 1, wherein the first micro-strand heat dissipator element portion of at least one of the plurality of first micro-strand heat dissipator elements extends into the first processing device from the outer surface of the first processing device and through the first processing device such that the first micro-strand heat dissipator element portion of the at least one of the plurality of first micro-strand heat dissipator elements is located immediately adjacent a heat producing component in the first processing device.

7. An Information Handling System (IHS), comprising:
a chassis;
a memory system that is included in the chassis and that stores instruction; and
a first processing device that is included in the chassis, coupled to the memory system, and configured to read instructions from the memory system to perform one or more operations;
a plurality of first micro-strand heat dissipator elements that are each positioned on the first processing device in a spaced apart orientation from the other first micro-strand heat dissipator elements, wherein each of the plurality of first micro-strand heat dissipator elements include:
a first micro-strand heat dissipator element portion that extends into the first processing device from an outer surface of the first processing device; and
a second micro-strand heat dissipator element portion that extends from the outer surface of the first processing device.

8. The IHS of claim 7, wherein the first processing device includes:
a plurality of micro-strand heat dissipator connector features that are each accessible on the outer surface of the first processing device in a spaced apart orientation from the other micro-strand heat dissipator connector features, wherein each of the plurality of first micro-strand heat dissipator elements are connected to a respective micro-strand heat dissipator connector feature.

9. The IHS of claim 7, wherein the plurality of first micro-strand heat dissipator elements are integrated as part of the first processing device.

10. The IHS of claim 7, wherein:
the outer surface of the first processing device includes a first outer surface and a second outer surface that is oriented substantially perpendicularly to the first outer surface;
each of a first subset of the plurality of first micro-strand heat dissipator elements extend from the first outer surface of the first processing device; and
each of a second subset of the plurality of first micro-strand heat dissipator elements extend from the second outer surface of the first processing device.

11. The IHS of claim 7, further comprising:
a second processing device that is included in the chassis, coupled to the memory system, configured to read instructions from the memory system to perform one or more operations, and coupled to the first processing device in a stacked processing system configuration;
a plurality of second micro-strand heat dissipator elements that are each positioned on the second processing device in a spaced apart orientation from the other second micro-strand heat dissipator elements, wherein each of the plurality of second micro-strand heat dissipator elements include:
a first micro-strand heat dissipator element portion that extends into the second processing device from the outer surface of the second processing device; and
a second micro-strand heat dissipator element portion that extends from the outer surface of the second processing device.

12. The IHS of claim 7, wherein the first micro-strand heat dissipator element portion of at least one of the plurality of first micro-strand heat dissipator elements extends into the first processing device from the outer surface of the first processing device and through the first processing device such that the first micro-strand heat dissipator element portion of the at least one of the plurality of first micro-strand heat dissipator elements is located immediately adjacent a heat producing component in the first processing device.

13. The IHS of claim 7, wherein the first processing device is a silicon photonics processing device.

14. A method for dissipating heat, comprising:
generating, by a first processing device that includes a plurality of first micro-strand heat dissipator elements that are each positioned on the first processing device in a spaced apart orientation from the other first micro-strand heat dissipator elements, heat;
conducting, by a first micro-strand heat dissipator element portion on each of the plurality of first micro-strand heat dissipator elements that extends into the first processing device from an outer surface of the first processing device, the heat that is generated by the first processing device to a respective second micro-strand heat dissipator element portion on that first micro-strand heat dissipator element that extends from the outer surface of the first processing device; and
dissipating, by the second micro-strand heat dissipator element portion on each of the plurality of first micro-strand heat dissipator elements that extends from the outer surface of the first processing device, the heat.

15. The method of claim 14, further comprising:
connecting each of the plurality of first micro-strand heat dissipator elements to respective micro-strand heat dissipator connector features that are each accessible on the outer surface of the first processing device in a spaced apart orientation from the other micro-strand heat dissipator connector features.

16. The method of claim 14, wherein the plurality of first micro-strand heat dissipator elements are integrated as part of the first processing device.

17. The method of claim 14, wherein:
the outer surface of the first processing device includes a first outer surface and a second outer surface that is oriented substantially perpendicularly to the first outer surface;
each of a first subset of the plurality of first micro-strand heat dissipator elements extend from the first outer surface of the first processing device; and
each of a second subset of the plurality of first micro-strand heat dissipator elements extend from the second outer surface of the first processing device.

18. The method of claim 14, further comprising:
generating, by a second processing device that is provided with the first processing device in a stacked processing system configuration and that includes a plurality of second micro-strand heat dissipator elements that are each positioned on the second processing device in a spaced apart orientation from the other second micro-strand heat dissipator elements, heat;
conducting, by a first micro-strand heat dissipator element portion on each of the plurality of second micro-strand heat dissipator elements that extends into the second processing device from an outer surface of the second processing device, the heat that is generated by the second processing device to a respective second micro-strand heat dissipator element portion on that second micro-strand heat dissipator element that extends from the outer surface of the second processing device; and
dissipating, by the second micro-strand heat dissipator element portion on each of the plurality of second micro-strand heat dissipator elements that extends from the outer surface of the second processing device, the heat.

19. The method of claim 14, the first micro-strand heat dissipator element portion of at least one of the plurality of first micro-strand heat dissipator elements extends into the first processing device from the outer surface of the first processing device and through the first processing device such that the first micro-strand heat dissipator element portion of the at least one of the plurality of first micro-strand heat dissipator elements is located immediately adjacent a heat producing component in the first processing device that generates the heat.

20. The method of claim 14, wherein the first processing device is a silicon photonics processing device.

* * * * *